(12) United States Patent
Wu et al.

(10) Patent No.: US 12,074,219 B2
(45) Date of Patent: Aug. 27, 2024

(54) BACK CHANNEL FIELD EFFECT TRANSISTORS USING A PULL BACK PROCESS AND METHODS FOR FORMING THE SAME

(71) Applicant: Taiwan Semiconductor Manufacturing Company Limited, Hsinchu (TW)

(72) Inventors: Yong-Jie Wu, Hsinchu (TW); Yen-Chung Ho, Hsinchu (TW); Hui-Hsien Wei, Taoyuan (TW); Chia-Jung Yu, Hsinchu (TW); Pin-Cheng Hsu, Zhubei (TW); Feng-Cheng Yang, Zhudong Township (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 289 days.

(21) Appl. No.: 17/523,076

(22) Filed: Nov. 10, 2021

(65) Prior Publication Data
US 2022/0344504 A1 Oct. 27, 2022

Related U.S. Application Data
(60) Provisional application No. 63/178,042, filed on Apr. 22, 2021.

(51) Int. Cl.
*H01L 29/786* (2006.01)
*H01L 29/417* (2006.01)
*H01L 29/423* (2006.01)
*H01L 29/45* (2006.01)
*H01L 29/49* (2006.01)

(52) U.S. Cl.
CPC ...... *H01L 29/786* (2013.01); *H01L 29/41733* (2013.01); *H01L 29/42384* (2013.01); *H01L 29/45* (2013.01); *H01L 29/4908* (2013.01)

(58) Field of Classification Search
None
See application file for complete search history.

(56) References Cited

U.S. PATENT DOCUMENTS

| 2012/0119211 A1* | 5/2012 | Lin | H01L 29/517 257/E21.411 |
| 2020/0098880 A1* | 3/2020 | Sharma | H10B 63/30 |

* cited by examiner

*Primary Examiner* — William C Trapanese
(74) *Attorney, Agent, or Firm* — The Marbury Law Group, PLLC

(57) ABSTRACT

A disclosed semiconductor device includes a substrate, a gate electrode formed on the substrate, a gate dielectric layer formed over the gate electrode, a source electrode located adjacent to a first side of the gate electrode, and a drain electrode located adjacent to a second side of the gate electrode. A gate dielectric formed from an etch-stop layer and/or high-k dielectric layer separates the source electrode from the gate electrode and substrate and separates the drain electrode from the gate electrode and the substrate. First and second oxide layers are formed over the gate dielectric and are located adjacent to the source electrode on the first side of the gate electrode and located adjacent to the drain electrode on the second side of the gate electrode. A semiconductor layer is formed over the first oxide layer, the second oxide layer, the source electrode, the drain electrode, and the gate dielectric.

20 Claims, 25 Drawing Sheets

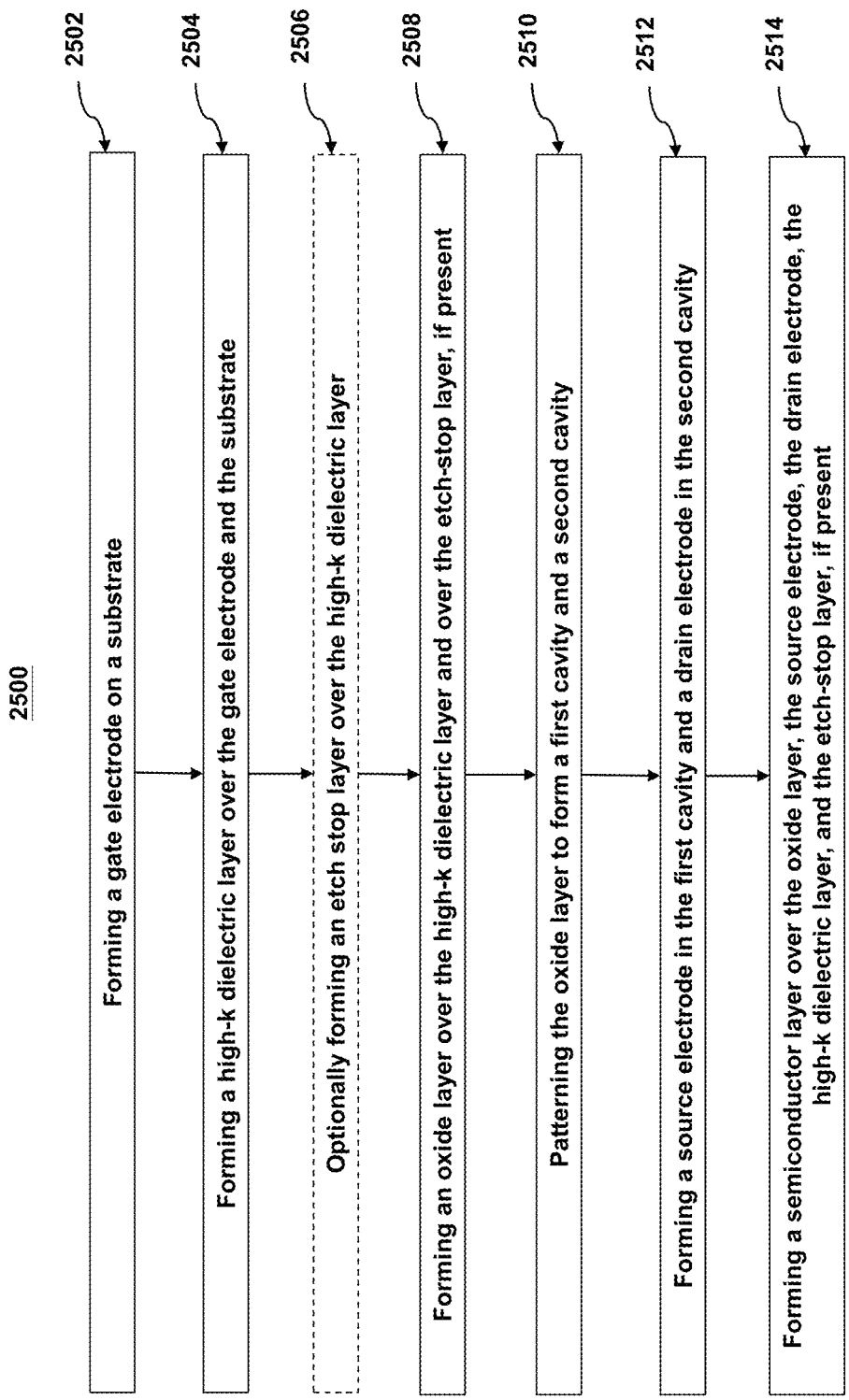

BACK CHANNEL FIELD EFFECT TRANSISTORS USING A PULL BACK PROCESS AND METHODS FOR FORMING THE SAME

RELATED APPLICATIONS

This application claims priority to U.S. Provisional Patent Application No. 63/178,042 entitled "Pull back process for back channel FET use" filed on Apr. 22, 2021, the entire contents of which are hereby incorporated by reference for all purposes.

BACKGROUND

Field Effect Transistors (FETs) may be formed in semiconductor devices for a wide variety of uses. FETs may be formed as front gate (also referred to as front channel) devices. In front channel FETs, a dielectric layer may be formed over a semiconductor channel layer. A gate electrode may be formed over the dielectric layer to apply a voltage to the semiconductor material and thereby create a channel in the semiconductor material that allows current to flow between a source electrode and a drain electrode.

FETs may also be formed as back gate (also referred to as back channel) devices. In a back channel FET, the gate electrode may be formed below the dielectric layer. A semiconductor channel layer may be formed over both the gate electrode and the dielectric material. Thus, when a voltage is applied to the gate electrode, a channel in the semiconductor material may also be formed that allows current to flow between a source electrode and a drain electrode.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 25 is a flowchart illustrating various stages of a further method of manufacturing an improved back channel FET device, according to various embodiments.

DETAILED DESCRIPTION

Figure 1:
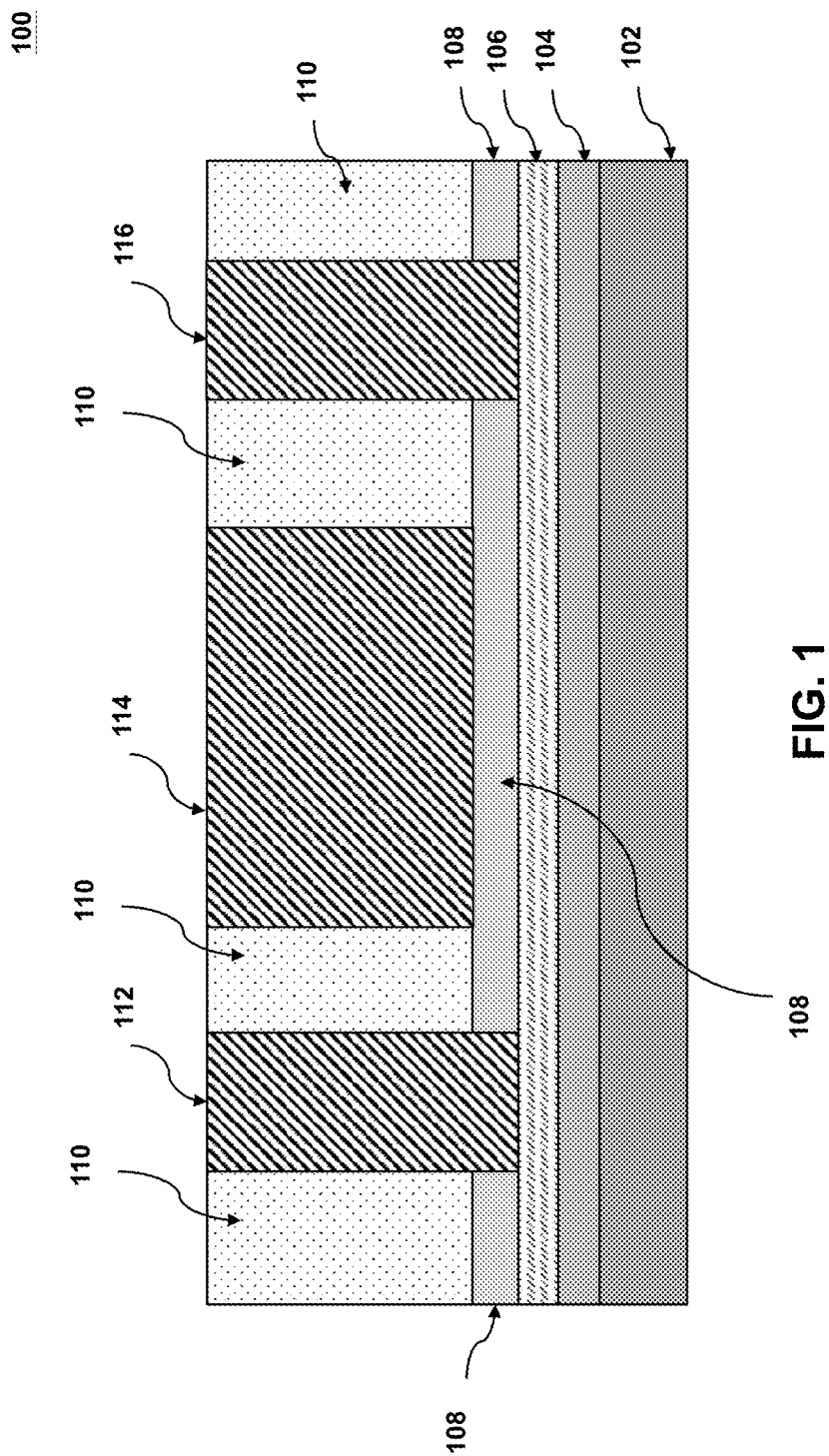
FIG. 1 is a vertical cross-sectional view of a front channel field effect transistor (FET) device, according to various embodiments.

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

In the semiconductor and integrated circuit (IC) industry there is constant economic pressure to reduce the size of ICs to thereby increase areal and volume density of digital circuits. To do so, individual transistors, interconnects, and related structures have become increasingly smaller. Front channel (also referred to as front gated) Field Effect Transistors (FETs) are well known transistor devices that are relatively easy to fabricate. To fabricate the front channel FET, a semiconducting channel material may be deposited over a substrate. A dielectric layer may be formed over a semiconducting channel material. However, the deposition process that forms the dielectric layer may damage the semiconducting channel material. Back channel (also referred to as back gated) FETs have been developed to overcome the potential damage to the semiconducting channel material by forming the gate electrode in the substrate and then forming the dielectric layer over the gate electrode. The semiconducting channel material may then be deposited after the dielectric layer is formed. In this manner, the semiconducting channel material may avoid potential damage as the semiconducting channel material may be deposited after the dielectric material layer. However, to fabricate the back channel FET, various complex chemical mechanical polish (CMP) and trench etch processes may be employed.

The various embodiment semiconductor devices and methods of forming the semiconductor devices disclosed herein may utilize a pull back process to simplify the manner in which such FETs may be fabricated. Various embodiments disclosed herein may use an etch-stop layer (ESL) to prevent an unintended electrical connection between fabricated gate electrodes with source and/or drain electrodes (i.e., electrical short). Disclosed embodiments specifically relate to back channel FETs and methods of forming the same. To provide a context for disclosed embodiment back channel FET devices, the structure and issues associated with a front channel FET are first described below, with reference to FIG. 1

FIG. 1 is a vertical cross-sectional view of a front channel field effect transistor (FET) device 100, according to various embodiments. The device 100 includes a substrate 102 and an optional oxide layer 104 formed over the substrate 102. In a front channel FET, a semiconductor layer 106 is deposited over the substrate 102 and an optional oxide layer 104. The semiconductor layer 106 may provide the channel between a source electrode 112 and a drain electrode 116 when a voltage is applied to a gate electrode 114. A gate dielectric 108 may be deposited over the semiconductor layer 106. However, the deposition process that forms the gate dielectric layer 108 may damage the semiconductor layer 106 that forms the channel. An oxide layer 110 may be formed over the gate dielectric 108. The oxide layer 110 and the gate dielectric 108 may be photolithographically patterned and anisotropically etched to form cavities into which conductive material may be deposited to form a source electrode 112, a gate electrode 114, and a drain electrode 116. In this process, the cavities formed for the source 112 and drain 116 electrodes are made by an etch process that etches through the oxide layer 110 and the gate dielectric 108 and down to the semiconductor layer 106 so that the conductive material may make conductive contact with the semiconductor layer 106. Such etching, however, may damage the semiconductor layer 106.

Figure 2:
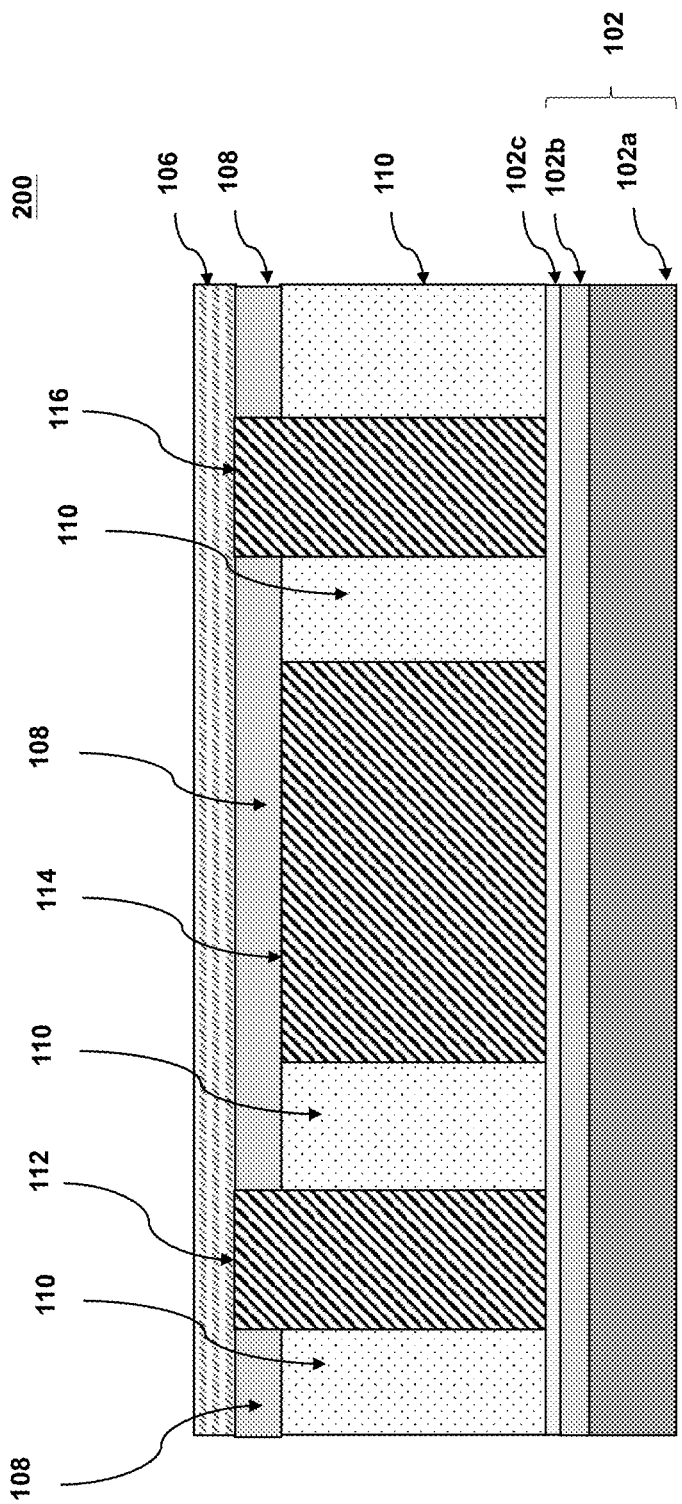
FIG. 2 is a vertical cross-sectional view of a back channel FET device, according to various embodiments.

FIG. 2 is a vertical cross-sectional view of a back channel FET device 200, according to various embodiments. The fabrication process to form the back channel FET device 200 may avoid the two problems mentioned above that are associated with the front channel FET device 100. The back channel FET 200 may include a substrate 102 containing a first substrate layer 102a (e.g., a silicon dioxide layer), a second substrate layer 102b, and a third substrate layer 102c. The second substrate layer 102b and the third substrate layer 102b may be barrier layers (e.g., including metal oxides or metal nitrides) that may be formed over the first substrate layer 102a. An oxide layer 110 may be deposited over the barrier layers 102b and 102c. A photoresist layer (not shown) may be deposited over the oxide layer 110 and photolithographically patterned and etched to form a via cavity. The via cavity may be filled with a conductive material to form a gate electrode 114.

A gate dielectric 108 may be formed over the oxide layer 110 and gate electrode 114. A photoresist layer (not shown) may be deposited over the oxide layer 110 and gate dielectric 108. The photoresist layer may be photolithographically patterned and etched to form a via cavities that may subsequently be filled to form the source electrode 112 and drain electrode 116. A semiconductor layer 106 may be formed above a gate dielectric 108 and, as such, removes the need to etch through the oxide layer 110 and through the gate dielectric 108. In such a configuration, the potential to damage the semiconductor layer 106 may be mitigated. Further, with the back channel FET device 200, potential damage due to the deposition process that may be used to form the gate dielectric 108 over the semiconductor layer 106 may be similarly avoided. The back channel FET device 200, however, requires a fairly complicated process involving trench etching and chemical mechanical planarization (CMP) to form the gate metal region 114 and the source 112 and drain 116 electrodes. The various embodiments disclosed herein provide improved back channel FET devices and methods for fabricating such devices, as described below.

Figure 3:
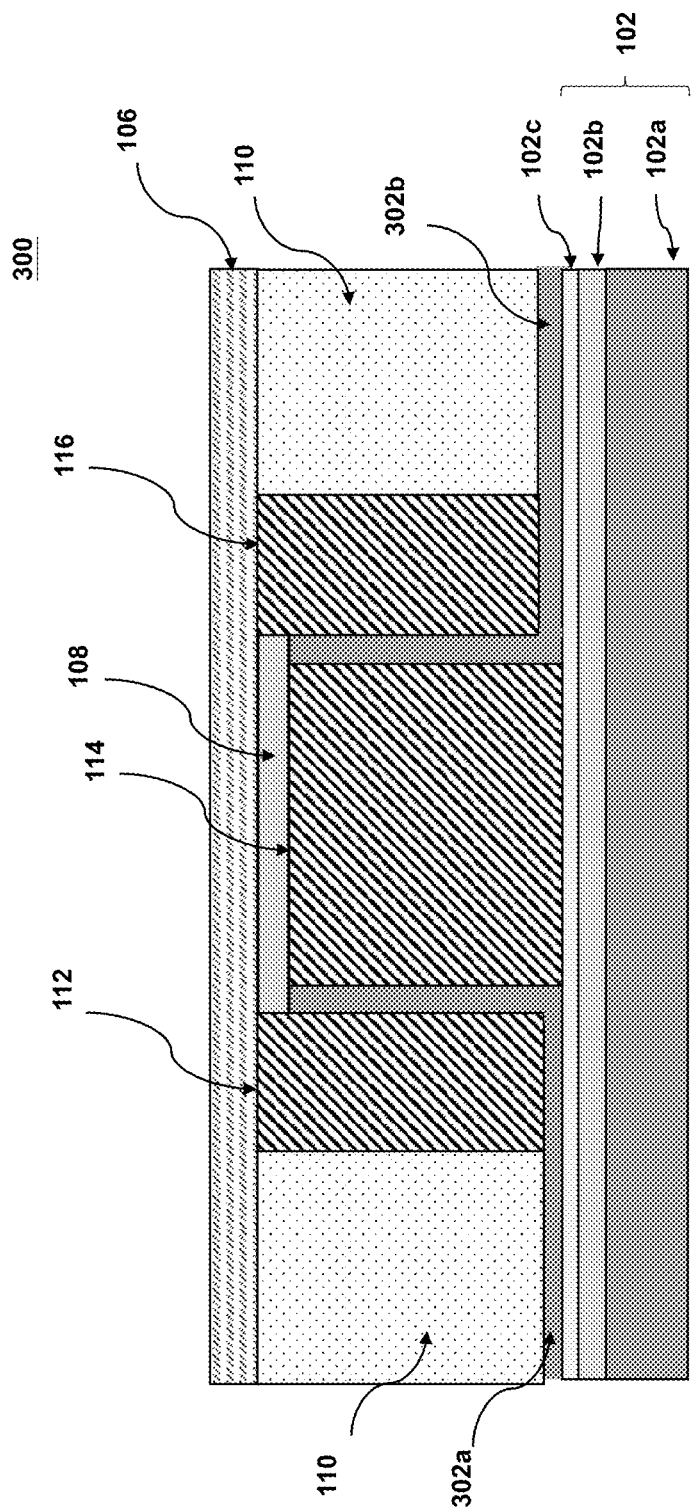
FIG. 3 is a vertical cross-sectional view of a back channel FET device that is formed using a pull back process, according to various embodiments.

FIG. 3 is a vertical cross-sectional view of a back channel FET device 300 that is formed using a pull back process, according to various embodiments. The back channel FET device 300 includes a substrate 102, an oxide layer 110, a source electrode 112, a gate electrode 114, a gate dielectric 108, and a drain electrode 116. The substrate 102 may include a first substrate layer 102a (e.g., a silicon dioxide layer), a second substrate layer 102b, and third substrate layer 102c. The second substrate layer 102b and third substrate layer 102c may act as super-barrier layers (e.g., metal oxides or metal nitrides).

The source electrode 112 and the drain electrode 116 may make direct electrical contact with a semiconductor layer 106. The semiconductor layer 106 may be doped to form source, channel, and drain regions. The back channel FET device 300 may further include a first etch-stop layer 302a and a second etch-stop layer 302b. For example, the first etch-stop layer 302a and the second etch-stop layer 302b may respectively separate the source electrode 112 from the gate electrode 114 and from the substrate 102 and separate the drain electrode 116 from the gate electrode 114 and from the substrate 102.

The operations performed to fabricate the back channel FET device 300 (and devices 1400 to 1500, 1900, and 2300 of FIGS. 14 to 15, 19, and 23, respectively) are described in greater detail with reference to FIGS. 4 to 23, below.

Figure 4:
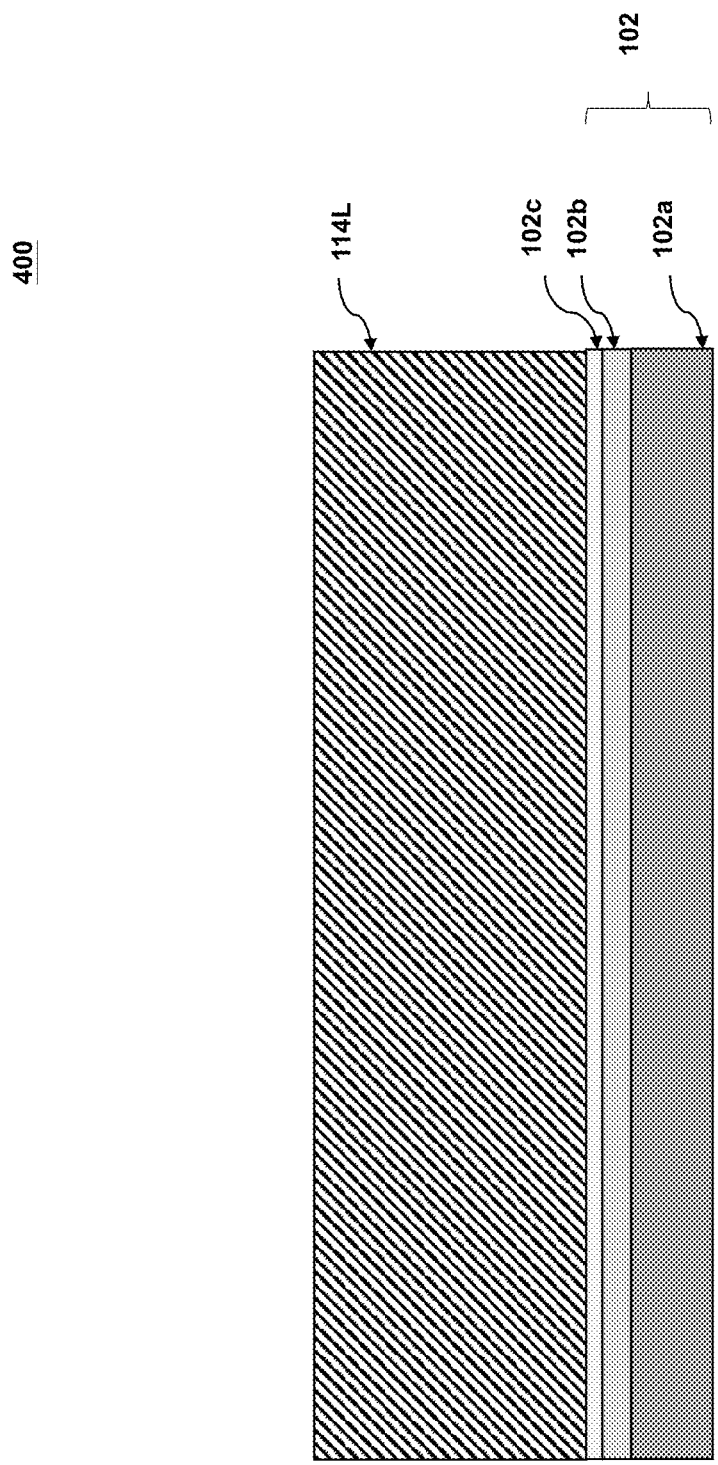
FIG. 4 is a vertical cross-sectional view of an intermediate structure used in the fabrication of the back channel FET devices of FIGS. 3 and 13 to 17, which are formed using a pull back process, according to various embodiments.

FIG. 4 is a vertical cross-sectional view of an intermediate structure 400 used in the fabrication of the improved back channel FET device 300 of FIG. 3. As described in greater detail below, the structure 400 of FIG. 4 may also be used in the fabrication of alternative improved back channel FET devices 1400 to 1500, 1900, and 2300 illustrated respectively in FIGS. 14 to 15, 19, and 23. Structure 400 includes a substrate 102 having a substrate layer 102a, super-barrier layers 102b and 102c, and a blanket layer of gate metal material 114L. The substrate layer 102a may include a bulk semiconductor substrate such as a silicon substrate or a semiconductor-on-insulator layer including the substrate layer 102a as a top semiconductor layer overlying a buried insulator layer (such as a silicon dioxide layer). Alternatively, the substrate layer 102a may be an oxide layer (e.g., silicon dioxide on silicon).

The super barrier layers 102b and 102c may include metal oxides or metal nitrides. For example, one or both of the super barrier layers 102b and 102c may include aluminum oxide. The blanket layer of gate metal material 114L may be deposited on the super barrier layer 102c. The blanket layer of gate metal material 114L layer may include any suitable metal, such as copper, aluminum, zirconium, titanium, tungsten, tantalum, ruthenium, palladium, platinum, cobalt, nickel, or alloys thereof. Other suitable materials are within the contemplated scope of this disclosure. The blanket layer of gate metal material 114L may be deposited by any suitable technique, such as chemical vapor deposition (CVD), plasma enhanced chemical vapor deposition (PECVD), atomic layer deposition (ALD), etc.

Figure 5:
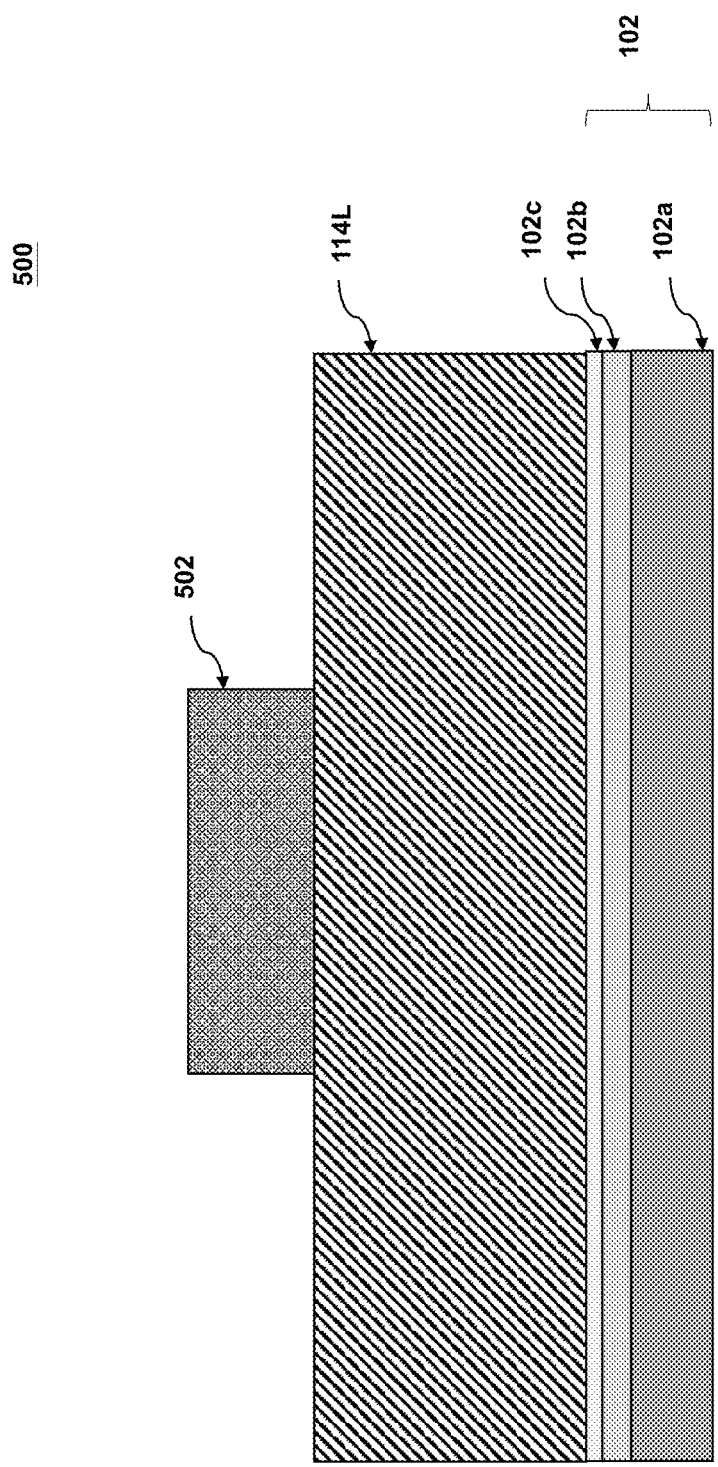
FIG. 5 is a vertical cross-sectional view of an intermediate structure in which a patterned photoresist has been formed on the intermediate structure of FIG. 4, according to various embodiments.

FIG. 5 is a vertical cross-sectional view of a further intermediate structure 500 in which a patterned photoresist 502 has been formed over the blanket layer of gate metal material 114L of the intermediate structure 400 of FIG. 4, according to various embodiments. In this regard, a photoresist may be deposited over the blanket layer of gate metal material 114L of the intermediate structure 400 of FIG. 4. The deposited photoresist may then be patterned using photolithography techniques to form the patterned photoresist 502. The patterned photoresist 502 may then be used as a mask while patterning the blanket layer of gate metal material 114L. Patterning of the blanket layer of gate metal material 114L may be performed by using an anisotropic etch process. After etching, any residual photoresist may be removed by ashing or dissolution with a solvent. The result of patterning the blanket layer of gate metal material 114L is shown in FIG. 6, below.

Figure 6:
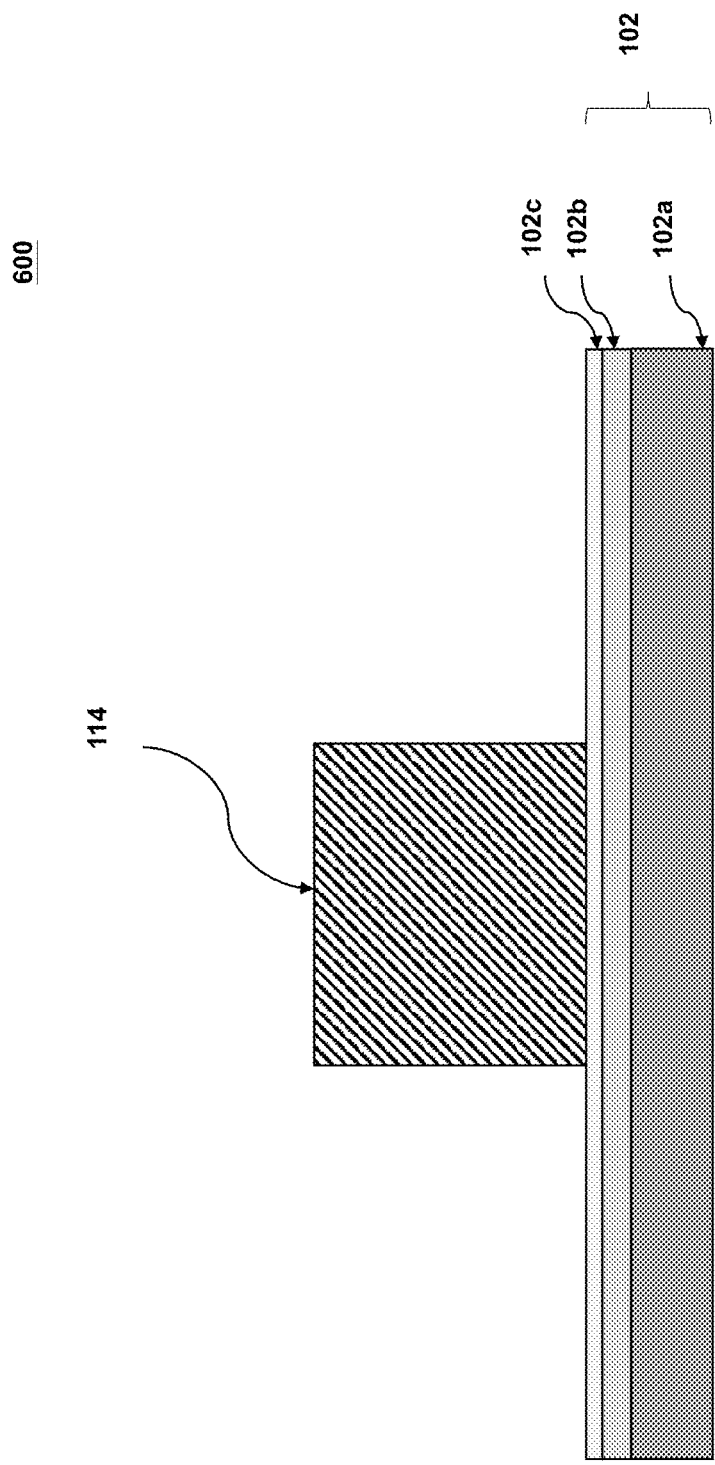
FIG. 6 is a vertical cross-sectional view of an intermediate structure after formation of a patterned gate electrode, according to various embodiments.

FIG. 6 is a vertical cross-sectional view of a further intermediate structure 600 in which a patterned gate electrode 114 may be formed by etching the blanket layer of gate metal material 114L of FIG. 5, according to various embodiments.

Figure 7:
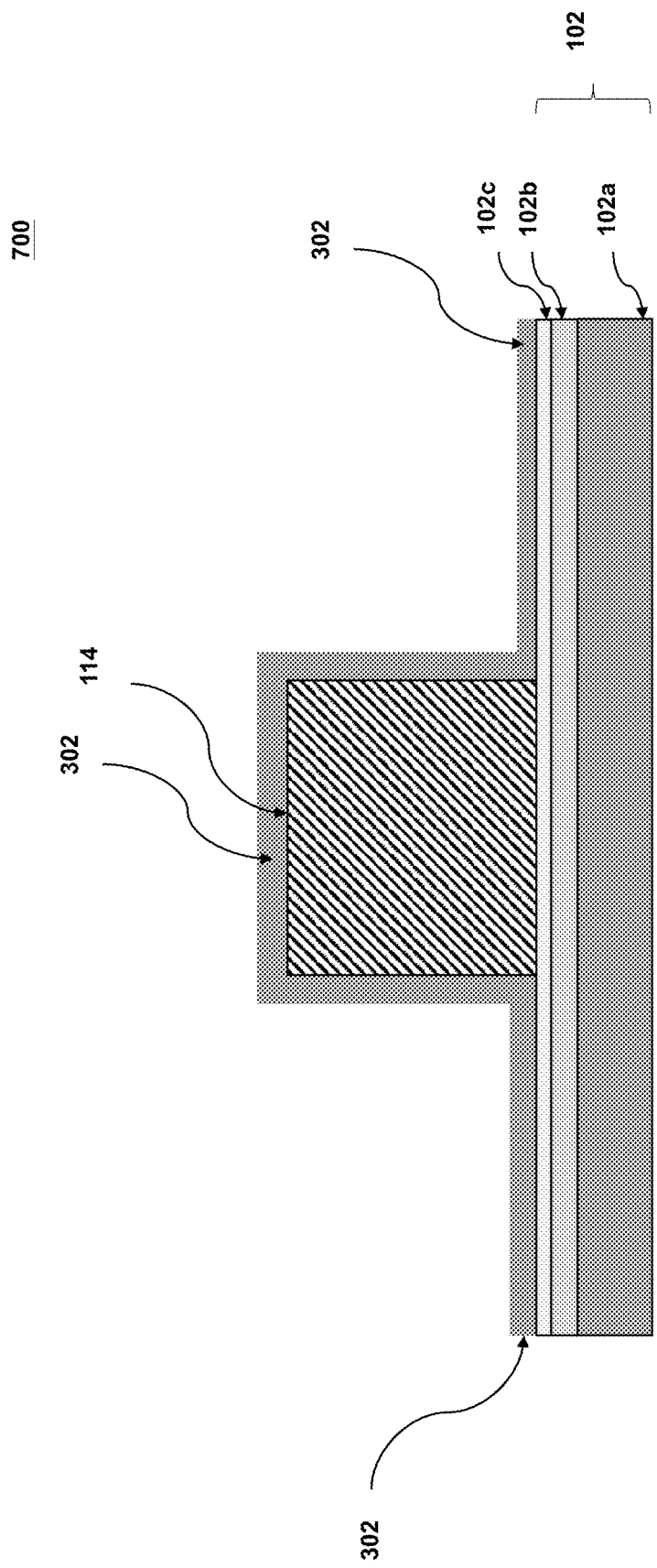
FIG. 7 is a vertical cross-sectional view of an intermediate structure after formation of an etch-stop layer on the intermediate structure of FIG. 6, according to various embodiments.

FIG. 7 is a vertical cross-sectional view of a further intermediate structure 700 after formation of an etch-stop layer 302 (ESL), according to various embodiments.

In this example, the etch-stop layer 302 may include a silicon-containing dielectric material such as silicon nitride, silicon oxynitride, silicon carbide, or silicon carbide nitride. The etch-stop layer 302 may be deposited by a conformal deposition process. For example, the etch-stop layer 302 may be formed by CVD, ALD, or physical vapor deposition (PVD). The etch-stop layer 302 may have a thickness in a range from 2 nm to 20 nm, such as from 3 nm to 12 nm, although lesser and greater thicknesses may also be used in other embodiments.

Figure 8:
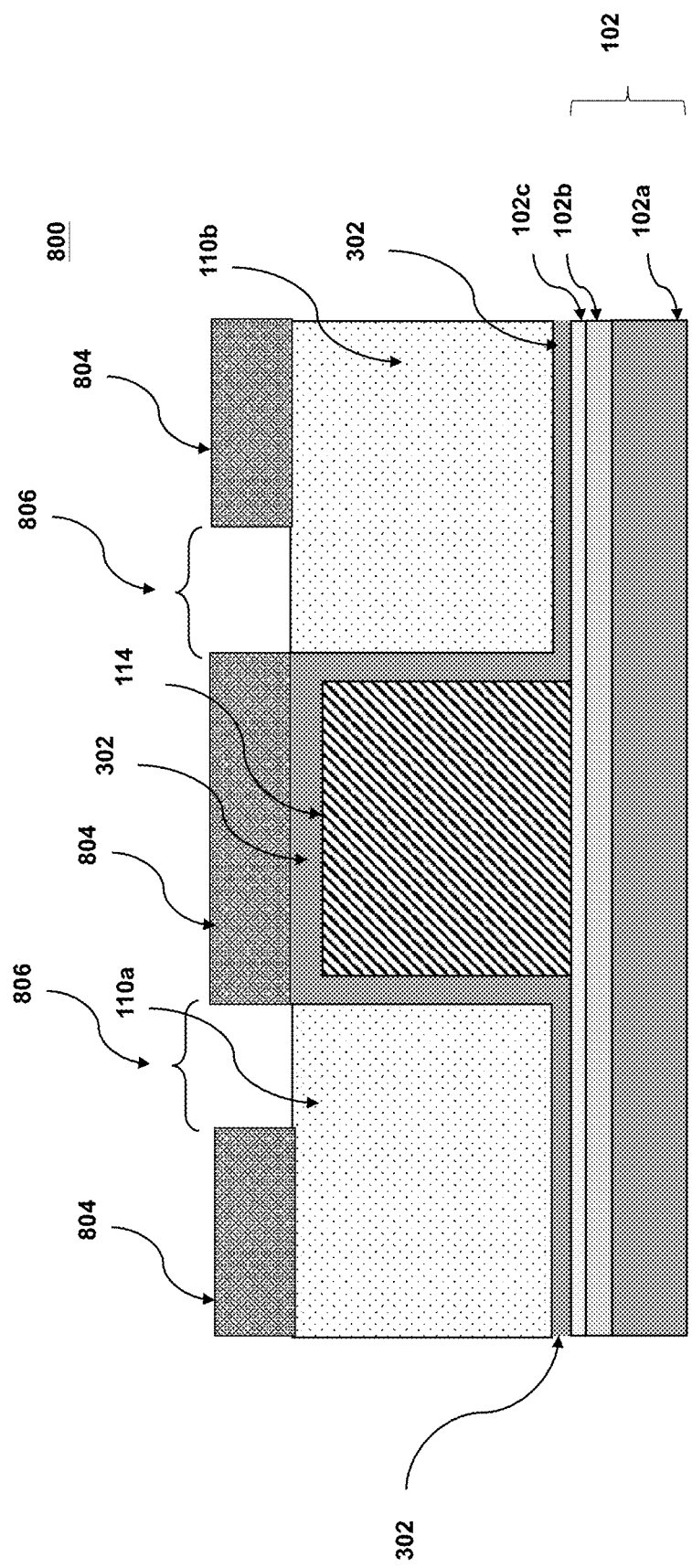
FIG. 8 is a vertical cross-sectional view of an intermediate structure after formation of an oxide layer and a patterned photoresist over the etch-stop layer of the intermediate structure of FIG. 7, according to various embodiments.

FIG. 8 is a vertical cross-sectional view of a further intermediate structure 800 according to various embodiments. The intermediate structure 800 may be formed by depositing an oxide layer 110 over portions of the etch-stop layer 302 of the intermediate structure 700 of FIG. 7, and by forming of a patterned photoresist 804 over the oxide layer 110 and over a portion of the etch-stop layer 302 that covers a top surface of the gate electrode 114. The oxide layer 110 may be deposited by a conformal deposition process (such as low pressure CVD) or a self-planarizing deposition process (such as spin coating). Excess portions of the deposited oxide layer 110 may be removed from above the top surface of the structure (i.e., above the portion of the etch-stop layer 302 covering the top surface of the gate electrode 114 in FIG. 7) by a planarization process, for example, by CMP. The planarization process may divide the oxide layer 110 into multiple portions such as a first oxide layer 110a and a second oxide layer 110b, as shown in FIG. 8.

The photoresist 804 may be patterned using photolithography techniques to generate openings 806 in the photoresist 804. The patterned photoresist 804 may be used as a mask for patterning the first oxide layer 110a and second oxide layer 110b. An anisotropic etch process may be performed to remove regions of the first oxide layer 110a and second oxide layer 110b to thereby generate source and drain cavities (not shown) that may be subsequently filled with a conductive material to respectively form a source electrode 112 and a drain electrode 116, as described in greater detail below with reference to FIG. 9. After etching, any residual photoresist may be removed by ashing or dissolution with a solvent.

Figure 9:
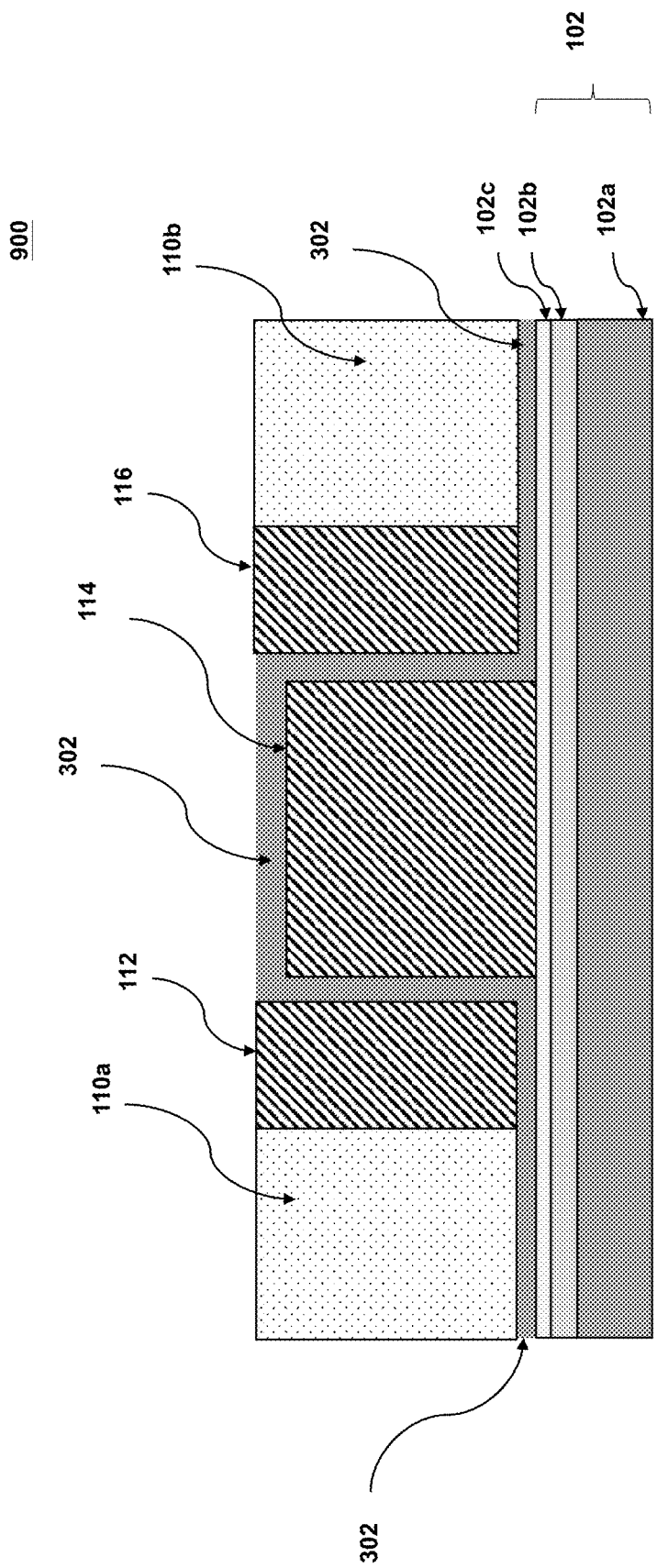
FIG. 9 is a vertical cross-sectional view of an intermediate structure after formation of source and drain electrodes, according to various embodiments.

FIG. 9 is a vertical cross-sectional view of a further intermediate structure 900 after formation the source electrode 112 and the drain electrode 116, according to various embodiments. In this regard, source and drain cavities (not shown) may have been formed by etching the first oxide layer 110a and the second oxide layer 110b using the patterned photoresist 804 of FIG. 8. A conductive material may then be deposited in the source and drain cavities to form the respective source electrode 112 and drain electrode 116.

The conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable conductive materials within the contemplated scope of this disclosure may also be used.

Excess portions of the conductive material may be removed from above a horizontal plane, including the top surface of the etch-stop layer 302, by a planarization process. The planarization process may include use of a CMP process and/or a recess etch process although other suitable planarization processes may be used. The remaining portion of the conductive material filling the source cavity constitutes the source electrode 112, and the remaining portion of the conductive material filling the drain cavity constitutes the drain electrode 116.

Figure 10:
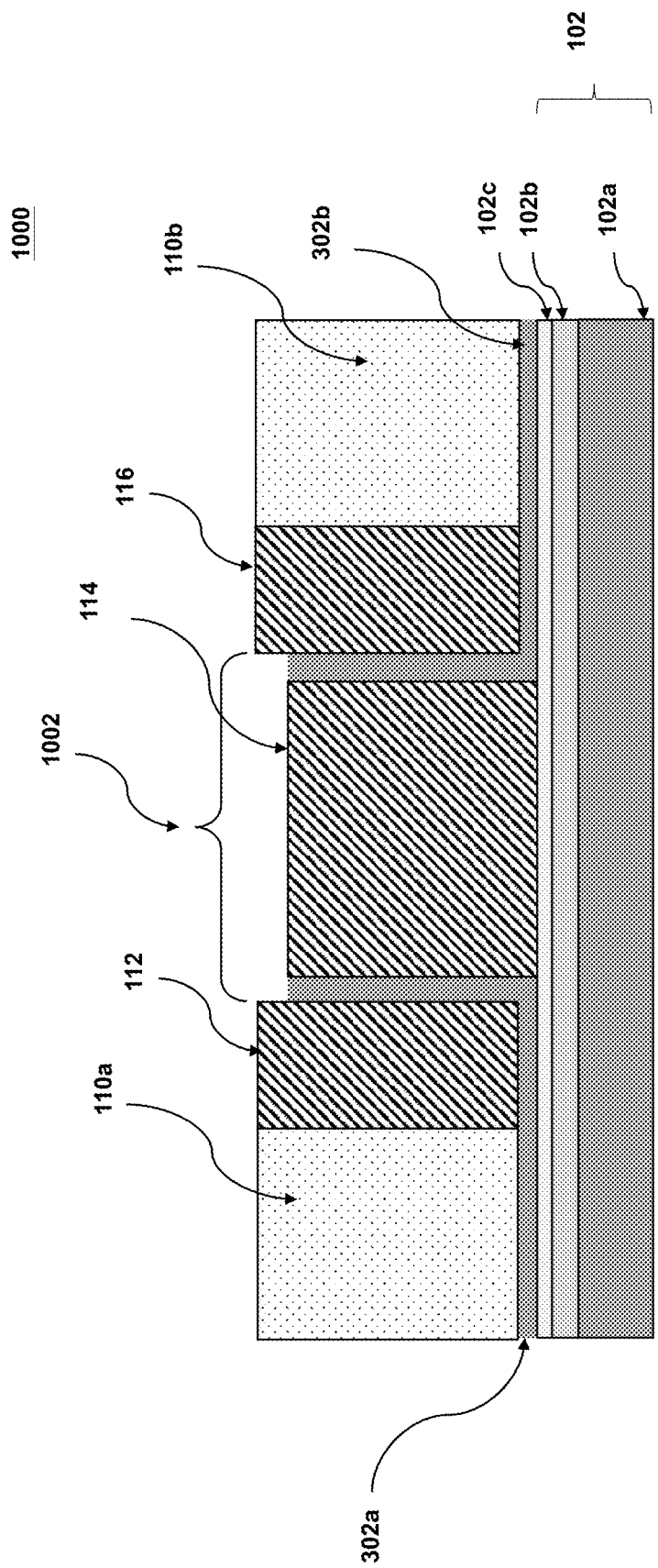
FIG. 10 is a vertical cross-sectional view of an intermediate structure after etching the structure of FIG. 9 to expose a top surface of the gate electrode, according to various embodiments.

FIG. 10 is a vertical cross-sectional view of a further intermediate structure 1000 after an anisotropic etch has been performed to generate a cavity 1002 thereby exposing the top surface of the gate electrode 114, according to various embodiments. Various wet and dry etching processes may be used to selectively etch the etch-stop layer 302. In embodiments in which the etch-stop layer 302 includes silicon nitride, for example, a wet etch may be performed using 80% to 100% phosphoric acid at a temperature in a range from 100° C. to 200° C. Similarly, a dry etch process may be performed including a mixture of tetrafluoro methane and sulfur hexafluoride with oxygen, at a total pressure in a range between 5 mtor and 1,000 mtor at a flow rate of between 10 sccm and 100 sccm at a temperature in a range from 0° C. to 60° C. Various other etch processes may be performed to selectively etch the etch-stop layer 302 to generate the cavity 1002.

As shown in FIG. 10, after etching the etch-stop layer 302 to form the cavity 1002, the remaining portions of the etch-stop layer 302 may form a first etch-stop layer 302a and a second etch-stop layer 302b. Put another way, the continuous etch-stop layer 302 may be divided into a first etch-stop layer 302a and a second etch-stop layer 302b. The first etch-stop layer 302a separates the source electrode 112 from the gate electrode 114 and separates the source electrode 112 from the substrate 102 (102a, 102b, 102c). The second etch-stop layer 302b separates the drain electrode 116 from the gate electrode 114 and separates the drain electrode 116 from the substrate 102 (102a, 102b, 102c).

Figure 11:
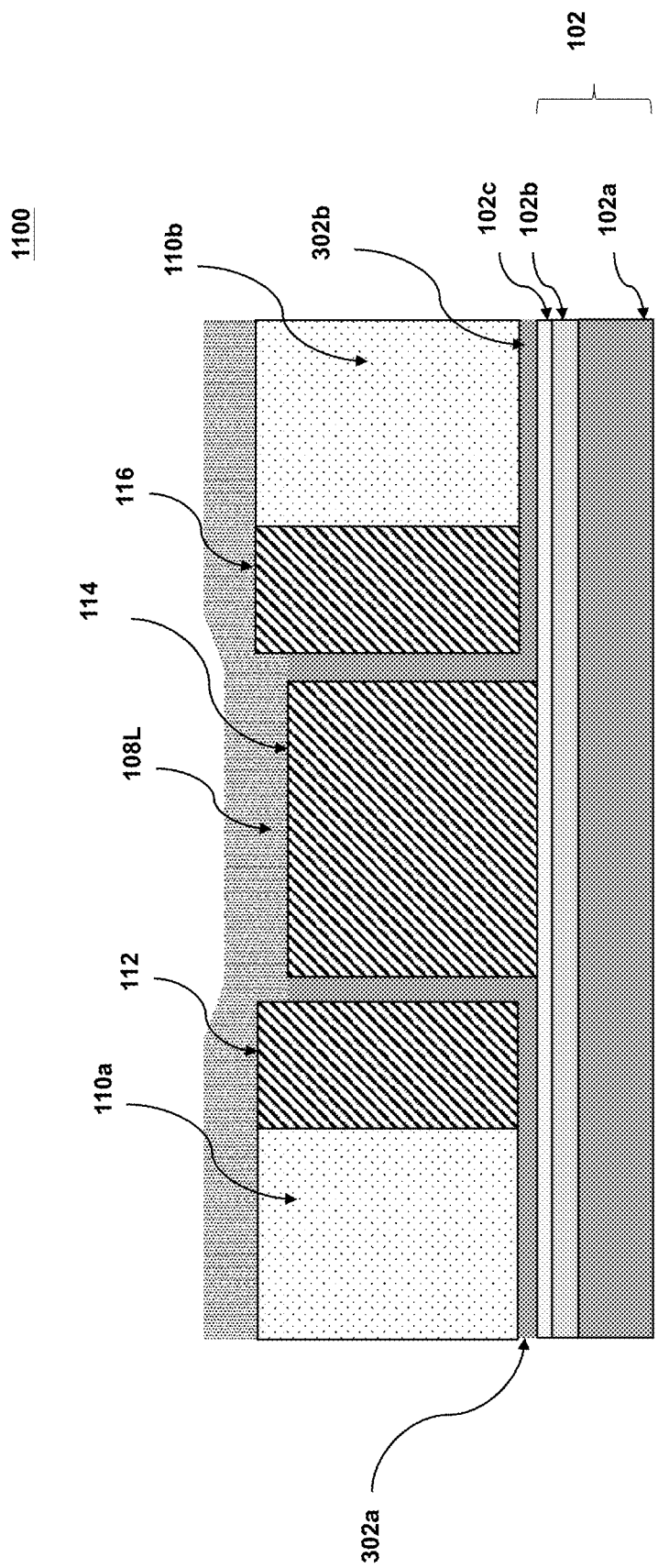
FIG. 11 is a vertical cross-sectional view of an intermediate structure after formation of a high-k dielectric layer over a top surface of the structure of FIG. 10, according to various embodiments.

FIG. 11 is a vertical cross-sectional view of a further intermediate structure 1100 after formation of a blanket layer of high-k dielectric material 108L over the structure 1000 of FIG. 10, according to various embodiments. The blanket layer of high-k dielectric 108L may be used to form the gate dielectric 108 that includes high-k dielectric material, as described in greater detail with reference to FIG. 12, below. The blanket layer of high-k dielectric 108L may be conformally deposited over the top surface of the structure 1000 of FIG. 10, which includes the first oxide layer 110a, the second oxide layer 110b, the patterned gate electrode 114, the source electrode 112, the drain electrode 116, the first etch-stop layer 302a, and the second etch-stop layer 302b.

Examples of high-k dielectric materials include, but are not limited to, hafnium oxide (HfO2), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, and hafnium dioxide-alumina (HfO2-Al2O3). Other suitable dielectric materials are within the contemplated scope of disclosure. In various embodiments, the high-k dielectric layer 108L may have a thickness in the range of 0.5-5.0 nm, such as 1-4 nm, although greater or lesser thicknesses may be used.

Figure 12:
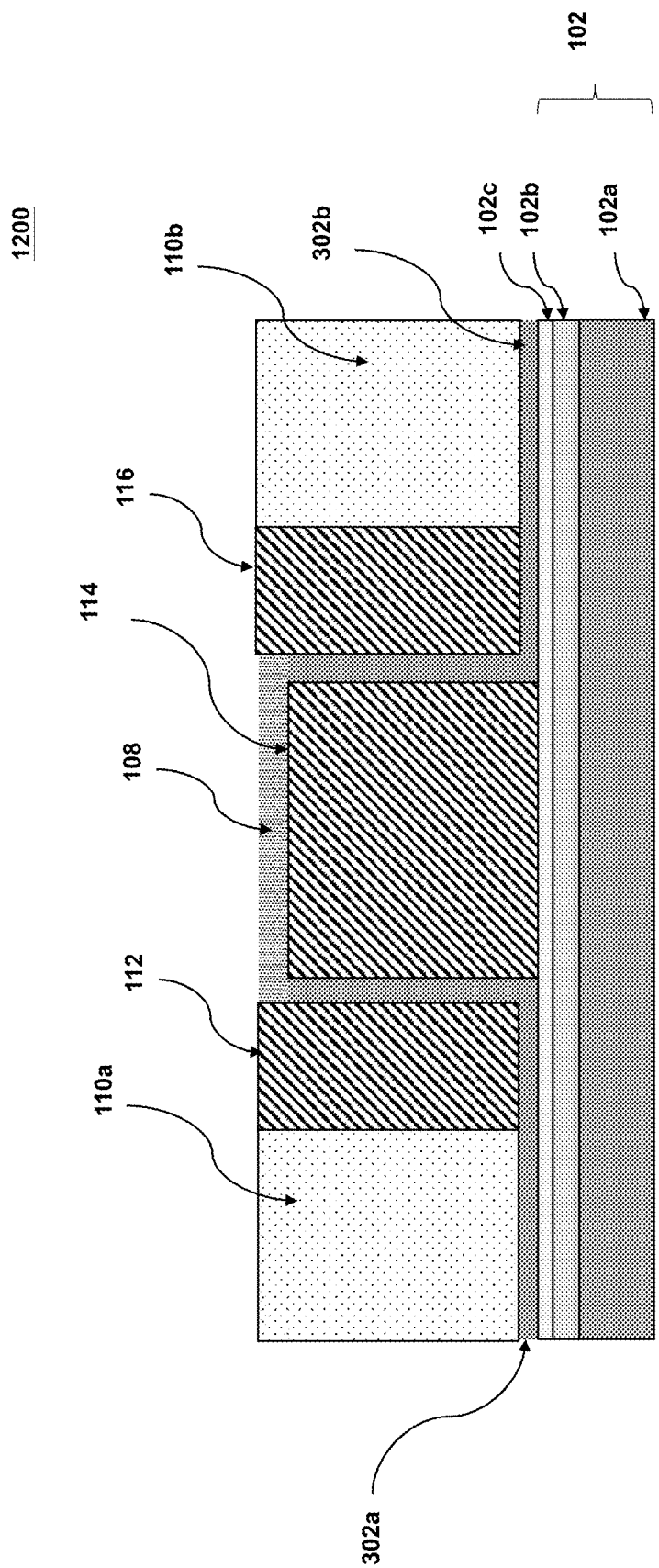
FIG. 12 is a vertical cross-sectional view of an intermediate structure after planarization of the structure of FIG. 11, according to various embodiments.

FIG. 12 is a vertical cross-sectional view of an intermediate structure 1200 after a planarization process has been performed on the structure 1100 of FIG. 11, according to various embodiments. In this regard, excess portions of the deposited blanket layer of high-k dielectric 108L may be removed from above the top surface of the structure of FIG. 11 by a planarization process, for example, by CMP. The resulting planarized layer of high-k dielectric material may serve as a gate dielectric 108. A semiconductor layer 106 may be deposited, which may form the source, channel, and drain regions of an improved back channel FET structure, as described in greater detail below with reference to FIG. 13.

Figure 13:
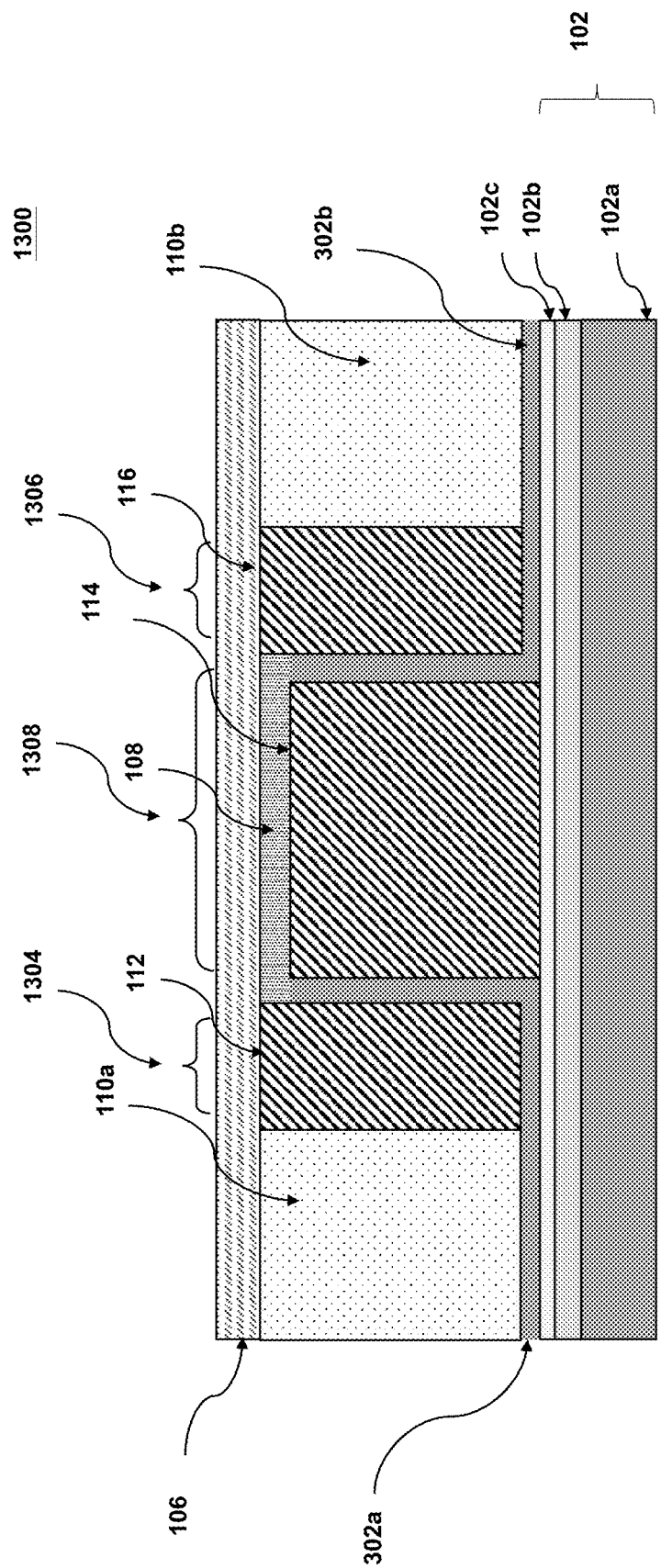
FIG. 13 is a vertical cross-sectional view of a back channel FET device formed after deposition of a semiconductor layer over a top surface of the structure of FIG. 12, according to various embodiments.

FIG. 13 is a vertical cross-sectional view of an improved back channel FET device 1300 formed after deposition of a semiconductor layer 106 over the structure 1200 of FIG. 12, according to various embodiments. The semiconductor layer 106 may include at least one elemental semiconductor material (e.g., single crystal silicon layer), at least one III-V compound semiconductor material, at least one II-VI compound semiconductor material, at least one organic semiconductor material, or other semiconductor materials.

The semiconductor layer 106 may have a doping of a first conductivity type, which may be p-type or n-type. For example, if the back channel FET device 1300 is to be an n-type FET, the semiconductor layer 106 may have a p-type doping. Alternatively, if the back channel FET device 1300 is to be an p-type FET, the semiconductor layer 106 may have an n-type doping. The dopant concentration in the semiconductor layer 106 may be in a range from $1.0 \times 10^{14}/cm^3$ to $1.0 \times 10^{18}/cm^3$, although lesser and greater dopant concentrations may also be employed. Portions of the semiconducting layer 106 near the source electrode 112 and the drain electrode 116 may include additional doping to thereby respectively form a source active region 1304 and a drain active region 1306. The additional doping may have a second conductivity type, which is the opposite of the first conductivity type. For example, if the first conductivity type is p-type, the second conductivity type is n-type, and vice versa.

The source active region 1304 and drain active region 1306 may be formed, for example, by ion implantation. A patterned photoresist (not shown) may be used to cover all regions of device 1300 except openings corresponding to locations where the source active region 1304 and the drain active region 1306 are to be formed. If the semiconducting layer has p-type doping, for example, n-type dopants can be implanted into the unmasked surface portions of the semiconductor layer 106 to respectively form the source active region 1304 and drain active region 1306. The atomic concentration of the dopants of the second conductivity type in each of the source active region 1304 and the drain active region 1306 may be in a range from $1.0 \times 10^{16}/cm^3$ to $2.0 \times 10^{19}/cm^3$, such as from $1.0 \times 10^{17}/cm^3$ to $1.0 \times 10^{18}/cm^3$. A region of lower doping of the first conductivity type (e.g., in a range from $1.0 \times 10^{14}/cm^3$ to $1.0 \times 10^{18}/cm^3$) may form a channel region 1308 of the back channel FET device 1300.

Figure 14:
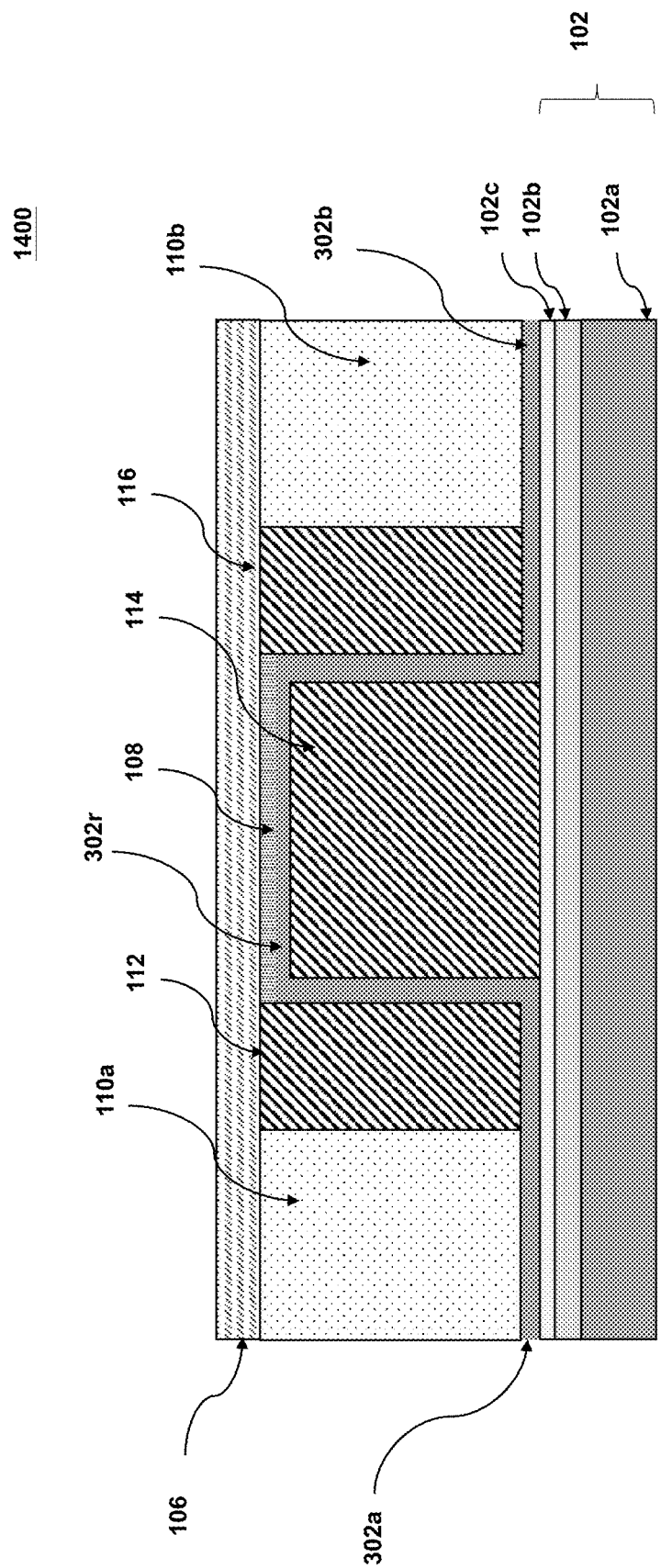
FIG. 14 is a vertical cross-sectional view of an alternative back channel FET device, according to various embodiments.
Figure 15:
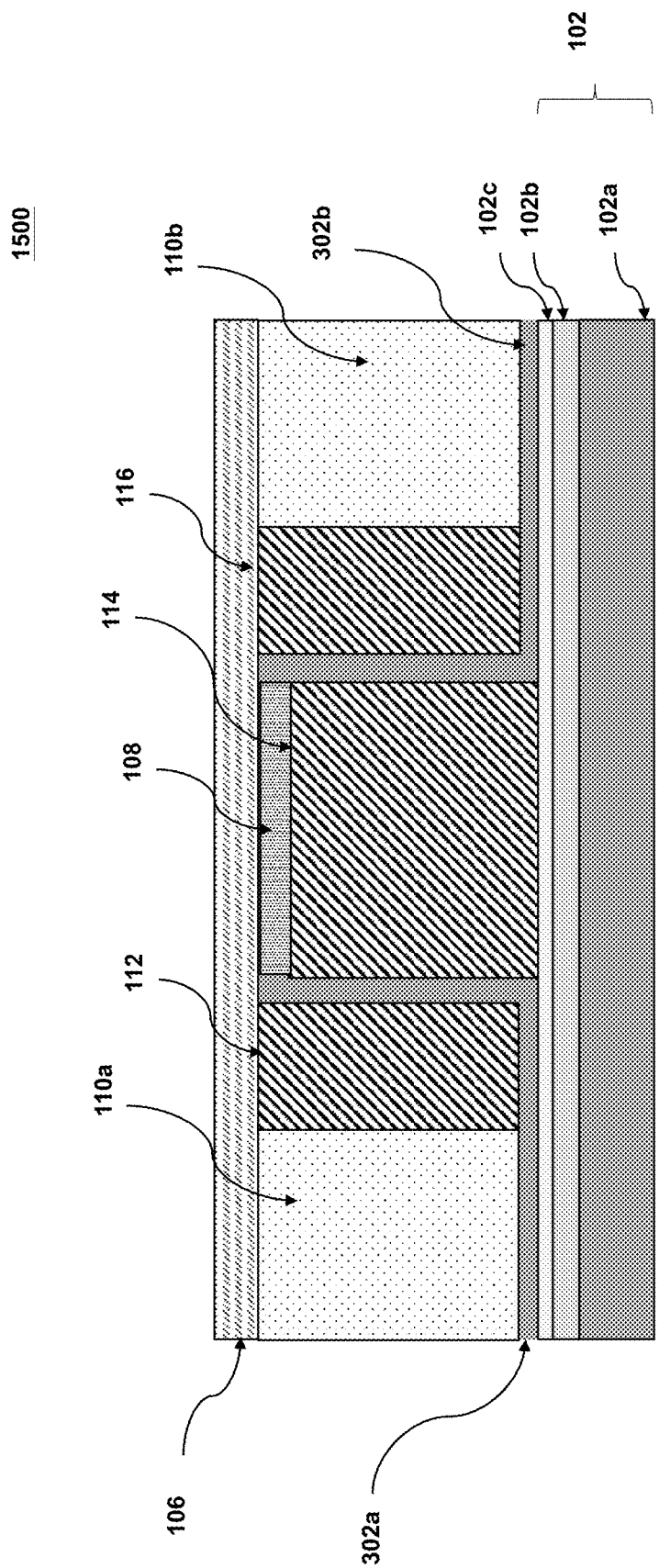
FIG. 15 is a vertical cross-sectional view of a further alternative back channel FET device, according to various embodiments.

FIGS. 14 and 15 illustrate alternative embodiments of the improved back channel FET device 1300 of FIG. 13. Comparison of FIGS. 13 and 14, for example, reveals differences in the materials that form the gate dielectric 108. For example, improved back channel FET device 1300 includes a gate dielectric 108 of uniform high-k dielectric material between the top surface of the gate electrode 114 and the bottom surface of the semiconductor layer 106. As described above, a portion of the etch-stop layer 302 above the gate electrode 114 (e.g., see FIG. 9) may be selectively etched to form the cavity 1002 thereby exposing the top surface of the gate electrode 114, as shown in FIG. 10. The gate dielectric 108 of uniform high-k dielectric material may be formed by depositing the blanket layer of high-k dielectric 108L directly on the top surface of the gate electrode 114 as shown in FIG. 11. Planarization of the blanket layer of high-k dielectric 108L may then be used to form the gate dielectric 108, as shown in FIG. 12. After planarization (e.g., see FIG. 12) the semiconductor layer 106 may be deposited to form the improved back channel FET device 1300 of FIG. 13.

In contrast, the improved back channel FET device 1400 of FIG. 14 may be formed by only partially removing the etch-stop layer 302 of FIG. 9 that covers the top surface of the gate electrode 114. Thus, instead of completely removing the etch-stop layer 302, as shown in FIG. 10, the etching process may be terminated before the top surface of the gate electrode 114 is exposed. Terminating the etch process in this manner, leaves a thin remaining portion 302r of the etch-stop layer 302 over the top surface of the gate electrode 114, which forms a part of the gate dielectric 108, as shown in FIG. 14. The remaining processes described above with reference to FIGS. 11 to 13 may be performed. In this regard, a blanket layer of high-k dielectric 108L may be formed (e.g., as described above with reference to FIG. 11) over the thin remaining layer of the etch-stop layer 302r as well as over the source electrode 112, drain electrode 116, the first oxide layer 110a, and the second oxide layer 110b. The blanket layer of high-k dielectric 108L may then be planarized using a planarization process such as CMP to form the gate dielectric 108. The gate dielectric 108 thus formed, is a multi-layer structure including the remaining portion 302r of the etch-stop layer 302 and the planarized high-k dielectric material 108L.

A semiconductor layer 106 may then be deposited to generate the improved back channel FET device 1400 of FIG. 14, which may include the multi-layer gate dielectric 108 that includes the remaining portion of the etch-stop layer 302r and the planarized high-k dielectric layer 108L.

The improved back channel FET device 1500 of FIG. 15 is similar to the improved back channel FET device 1300 of FIG. 13. As with the improved back channel FET device 1400 of FIG. 14, the differences between device 1500 and device 1300 relate to the configuration of the first etch-stop layer 302a, the second etch-stop layer 302b, and the high-k dielectric layer 108L, as shown in FIG. 15. To generate device 1300, the etch process leading to the cavity 1002 (e.g., see FIG. 10) completely removed the horizontal portion of the etch-stop layer 302 above the gate electrode 114 (e.g., compare FIGS. 9 and 10). To generate device 1500 of FIG. 15, an etch process may be used that only etches a horizontal portion of the etch-stop layer 302 that is directly over the top surface of the gate electrode 114. In this regard, in device 1500 the first etch-stop layer 302a and the second etch-stop layer 302b each extend vertically from the third substrate layer 102c up to the semiconductor layer 106.

Upon completion of above-described etch process, a blanket layer of high-k dielectric material may be deposited (e.g., as described above with reference to FIG. 11), followed by planarization (e.g., as described above with reference to FIG. 12), followed by deposition of the semiconductor layer 106 (e.g., see FIG. 13). The resulting structure is shown in FIG. 15. Thus, the alternative embodiment back channel FET device 1500 of FIG. 15 may include a gate dielectric 108 of uniform high-k dielectric material. However, top surfaces of the first etch-stop layer 302a and the second etch-stop layer 302b may be co-planar with a top surface of the gate dielectric 108.

The fabrication of each of structures 300, 1300, 1400, and 1500, respectively illustrated in FIGS. 3, 13, 14, and 15, proceeds by a conformal deposition of an etch-stop layer 302 over the gate electrode 114, as described above with reference to FIG. 7. Further embodiments, however, may start with deposition of a high-k dielectric layer over the gate electrode 114 as shown, for example, in FIG. 16.

Figure 16:
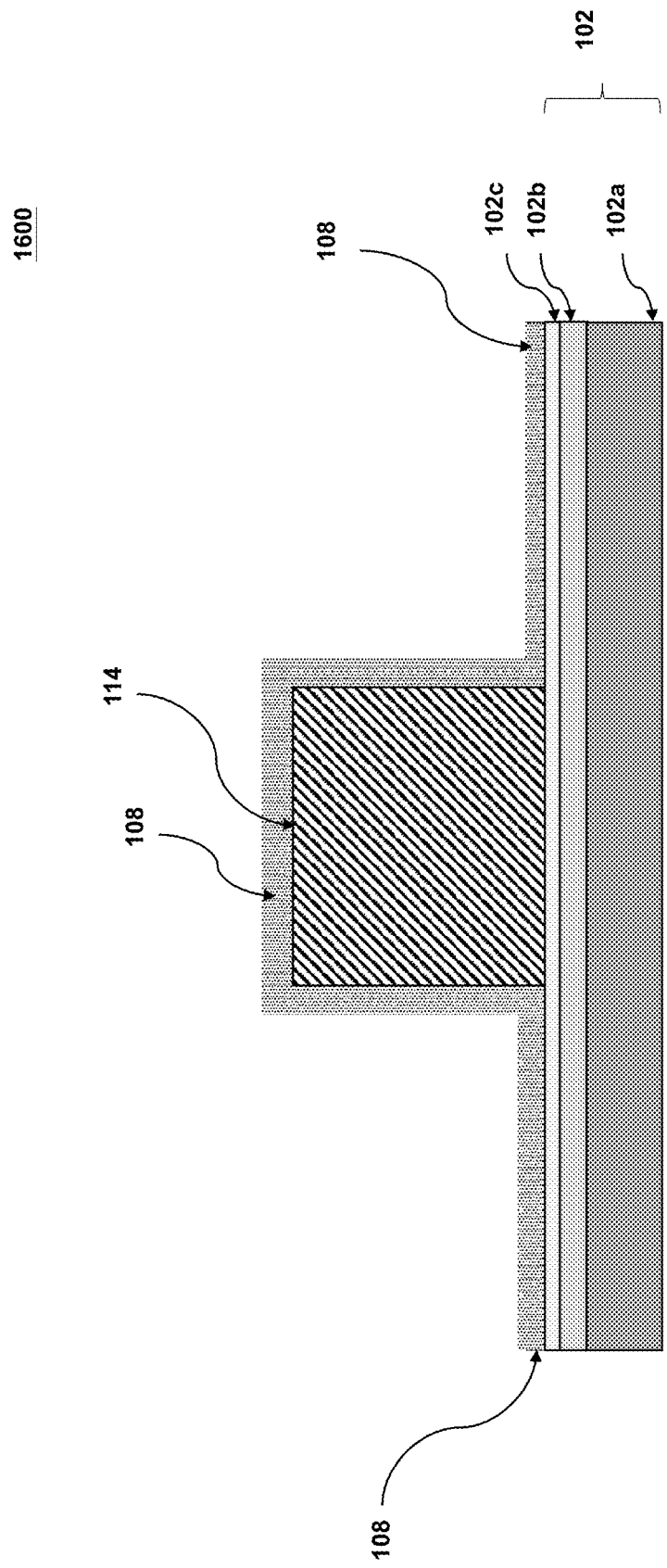
FIG. 16 is a vertical cross-sectional view of an intermediate structure after formation of a high-k dielectric layer on the intermediate structure of FIG. 6, according to various embodiments.
Figure 17:
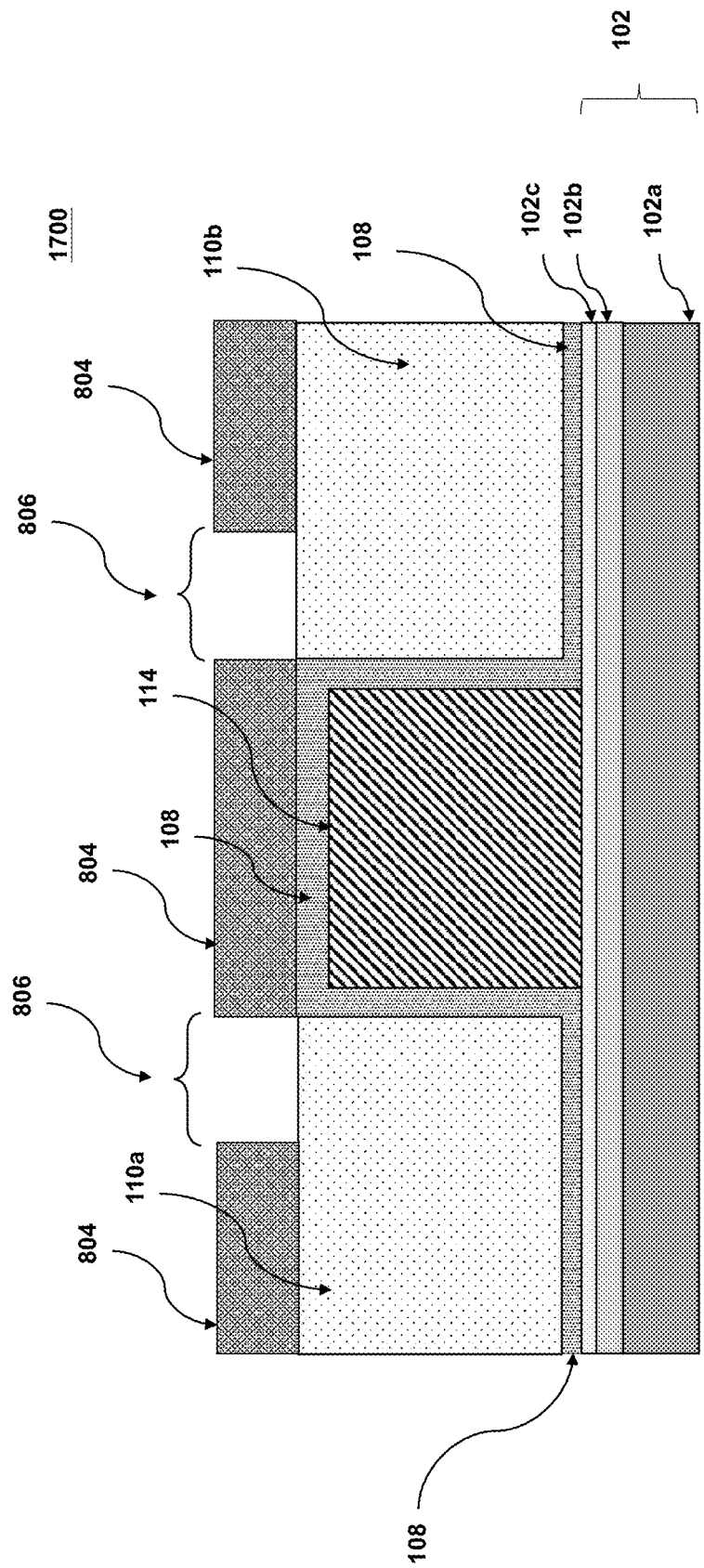
FIG. 17 is a vertical cross-sectional view of an intermediate structure after formation of an oxide layer and a patterned photoresist over the high-k dielectric layer of the intermediate structure of FIG. 16, according to various embodiments.
Figure 18:
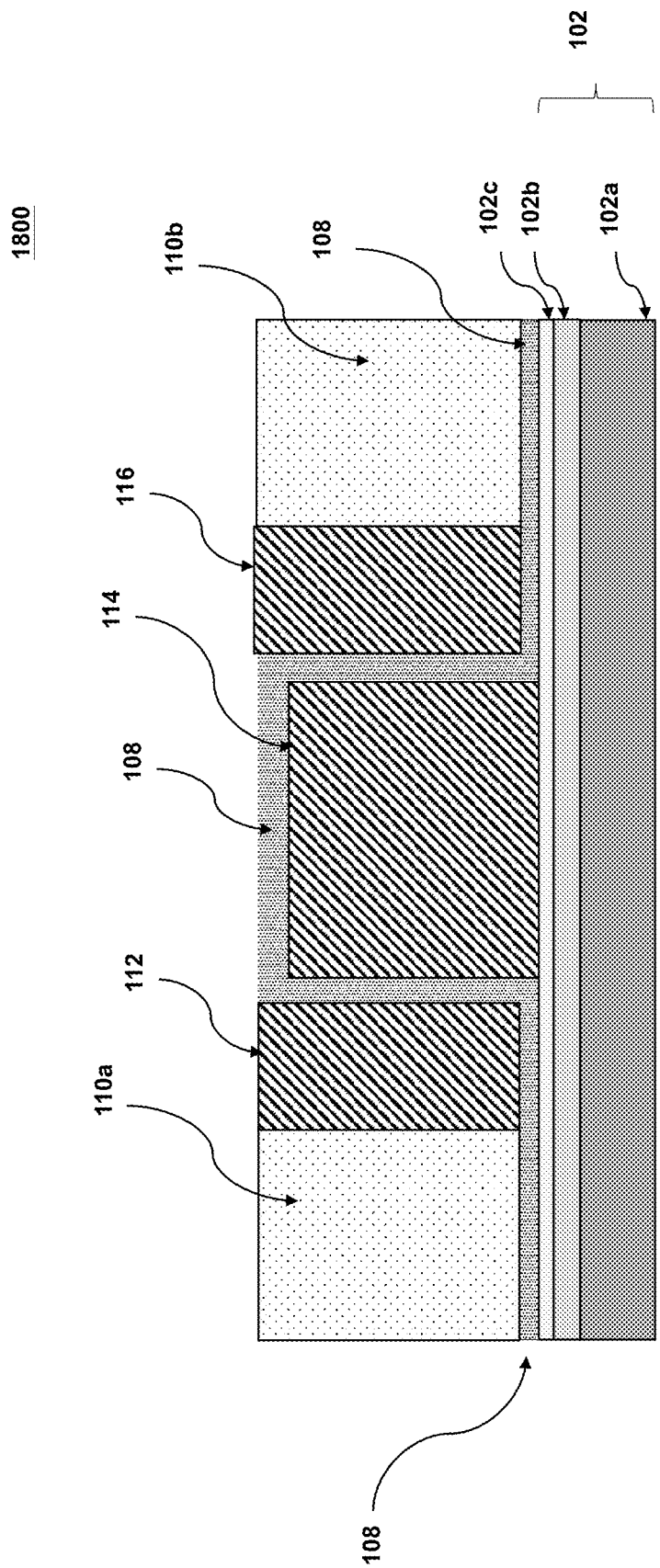
FIG. 18 is a vertical cross-sectional view of an intermediate structure after formation of source and drain electrodes in the intermediate structure of FIG. 17, according to various embodiments.
Figure 19:
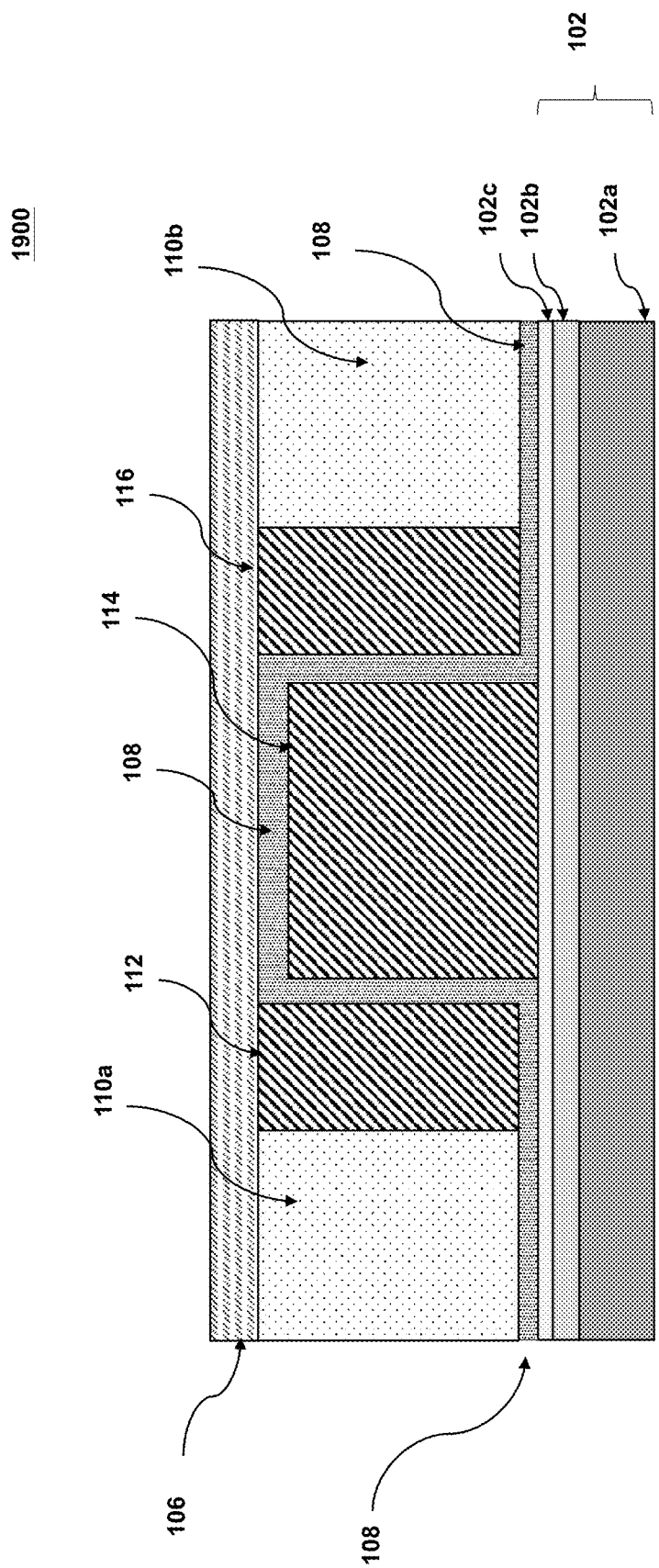
FIG. 19 is a vertical cross-sectional view of a back channel FET device formed after deposition of a semiconductor layer over a top surface of the intermediate structure of FIG. 18, according to various embodiments.

FIGS. 16 to 18 illustrate intermediate structures 1600, 1700 and 1800 in the formation of the improved back channel FET device 1900 of FIG. 19, according to various embodiments. As shown in FIG. 16, for example, a high-k dielectric layer 108L may be formed over the gate electrode 114 including over the top and side surfaces of the gate electrode 114 and over surfaces of the substrate 102 adjacent to the gate electrode 114. Thus, the gate dielectric 108 may be formed from a uniform high-k dielectric material. FIG. 17 illustrates an intermediate structure 1700 after deposition of a first oxide layer 110a, a second oxide layer 110b, and a patterned photoresist 804, as described above with reference to FIG. 8. FIG. 18 illustrates an intermediate structure 1800 after formation of a source electrode 112 and a drain electrode 116 in the intermediate structure 1700 of FIG. 17. FIG. 19 is a vertical cross-sectional view of a back channel FET device 1900 formed after deposition of a semiconductor layer over a top surface of the intermediate structure 1800 of FIG. 18, according to various embodiments.

Figure 20:
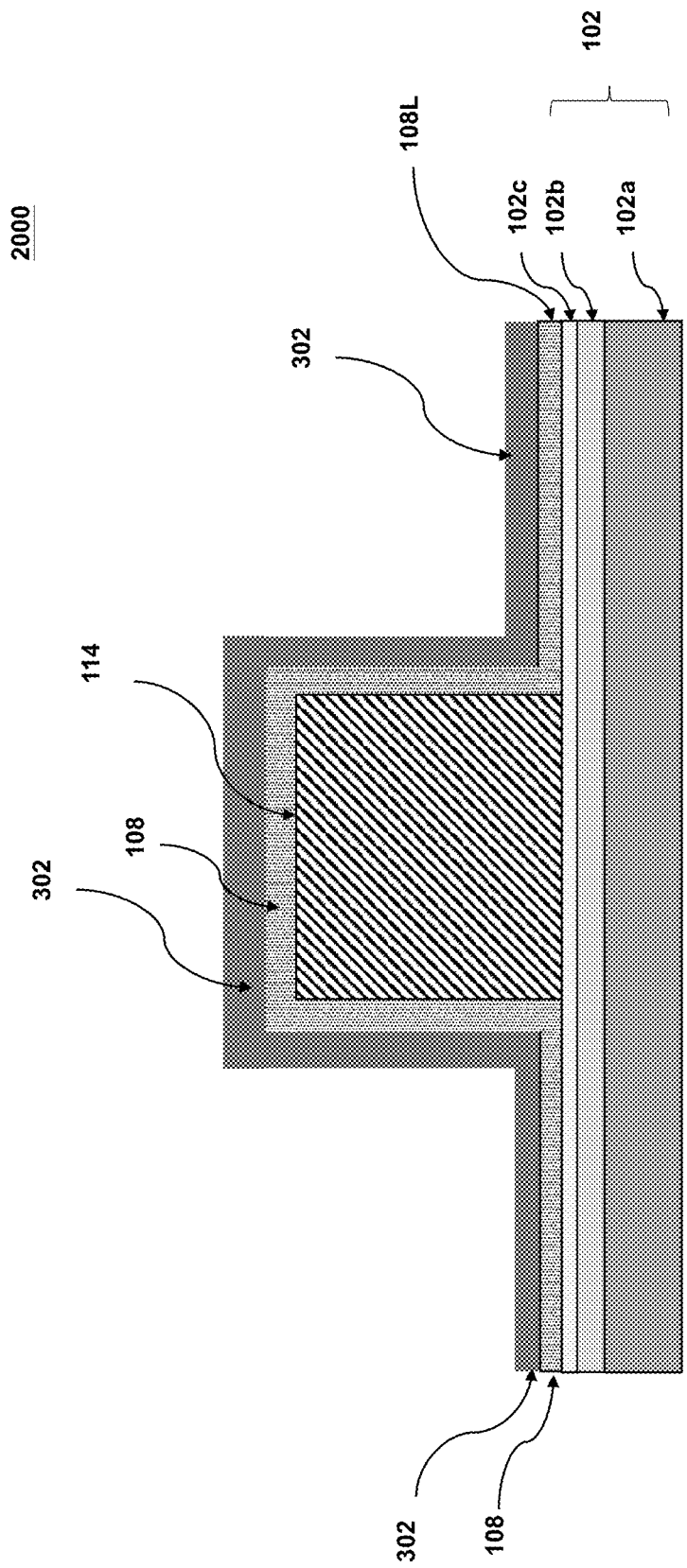
FIG. 20 is a vertical cross-sectional view of an intermediate structure after formation of an etch-stop layer over the intermediate structure of FIG. 16, according to various embodiments.
Figure 21:
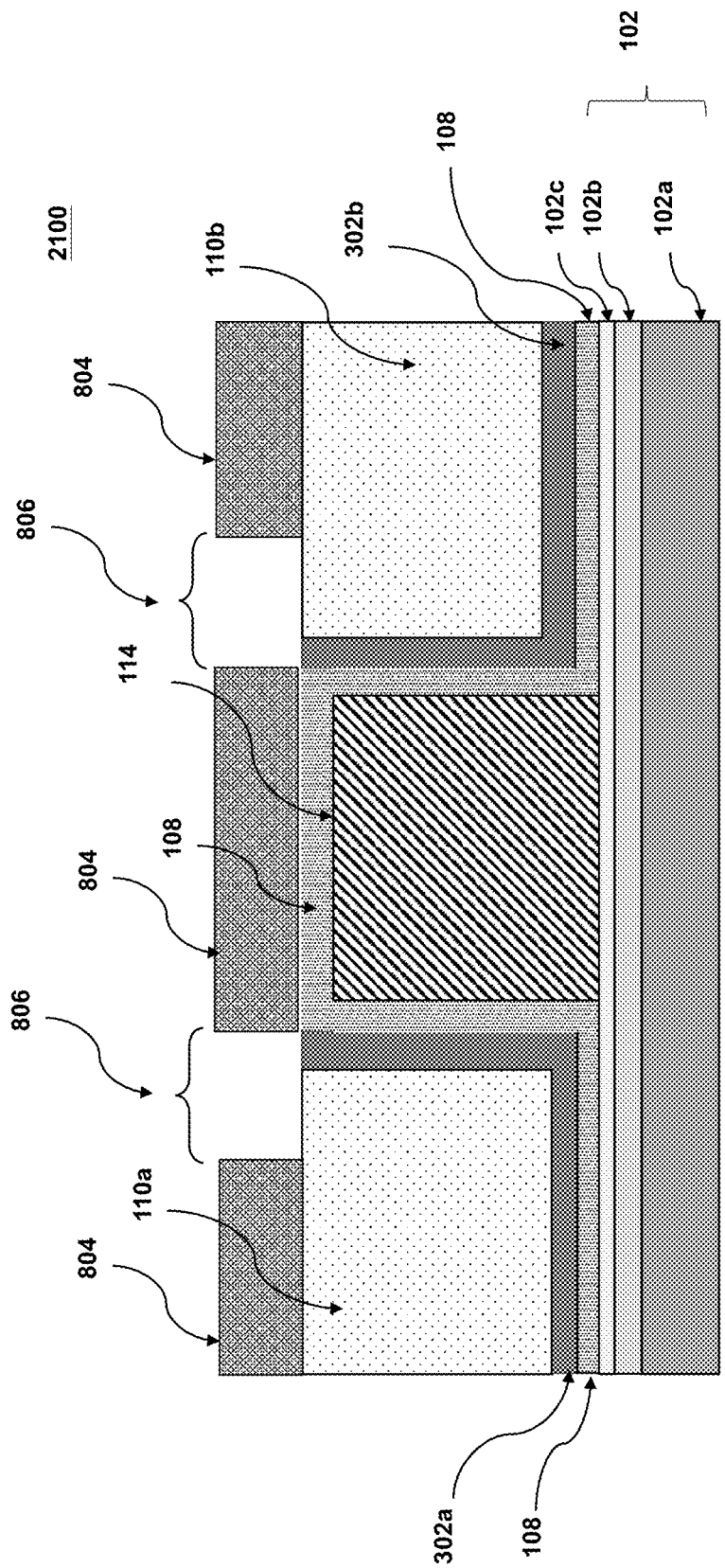
FIG. 21 is a vertical cross-sectional view of an intermediate structure after formation of an oxide layer and a patterned photoresist over the etch-stop layer of the intermediate structure of FIG. 20, according to various embodiments.
Figure 22:
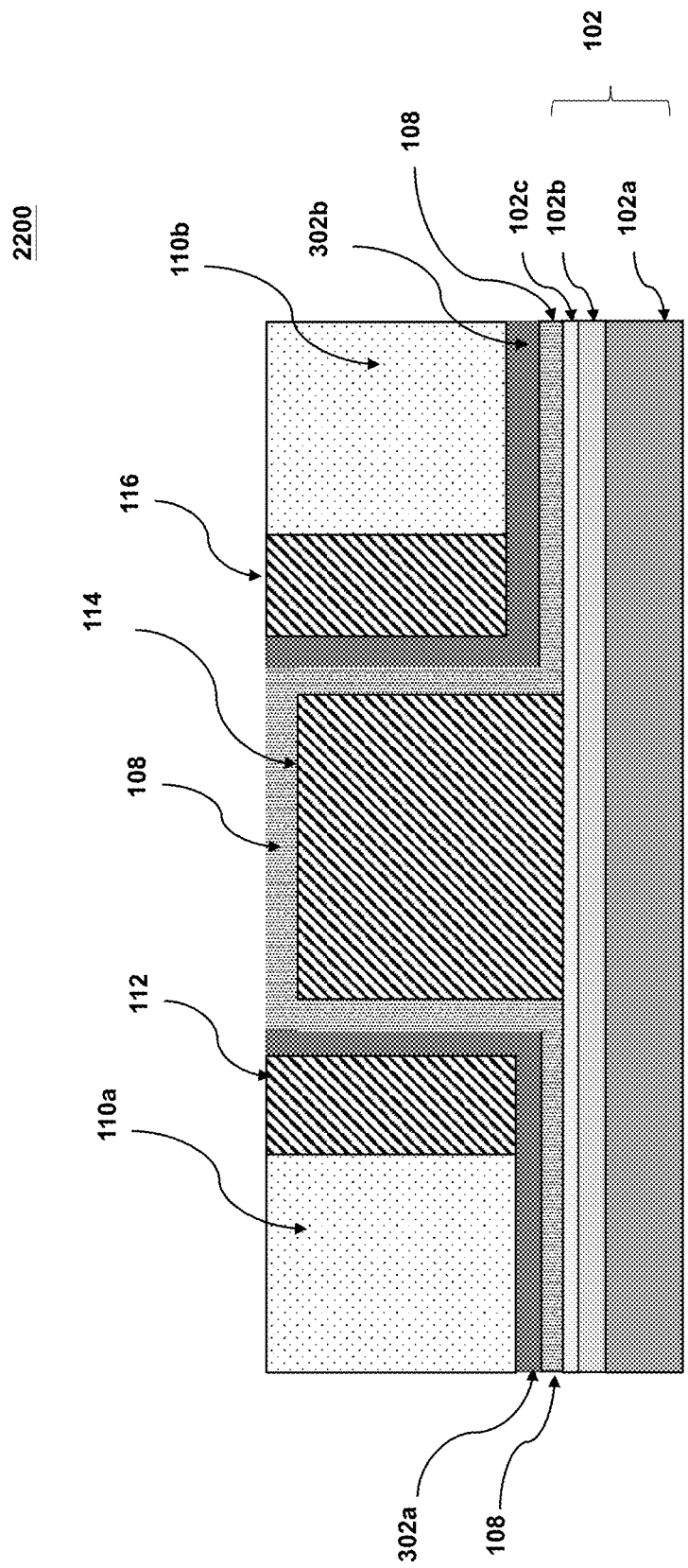
FIG. 22 is a vertical cross-sectional view of an intermediate structure after formation of source and drain electrodes in the intermediate structure of FIG. 21, according to various embodiments.
Figure 23:
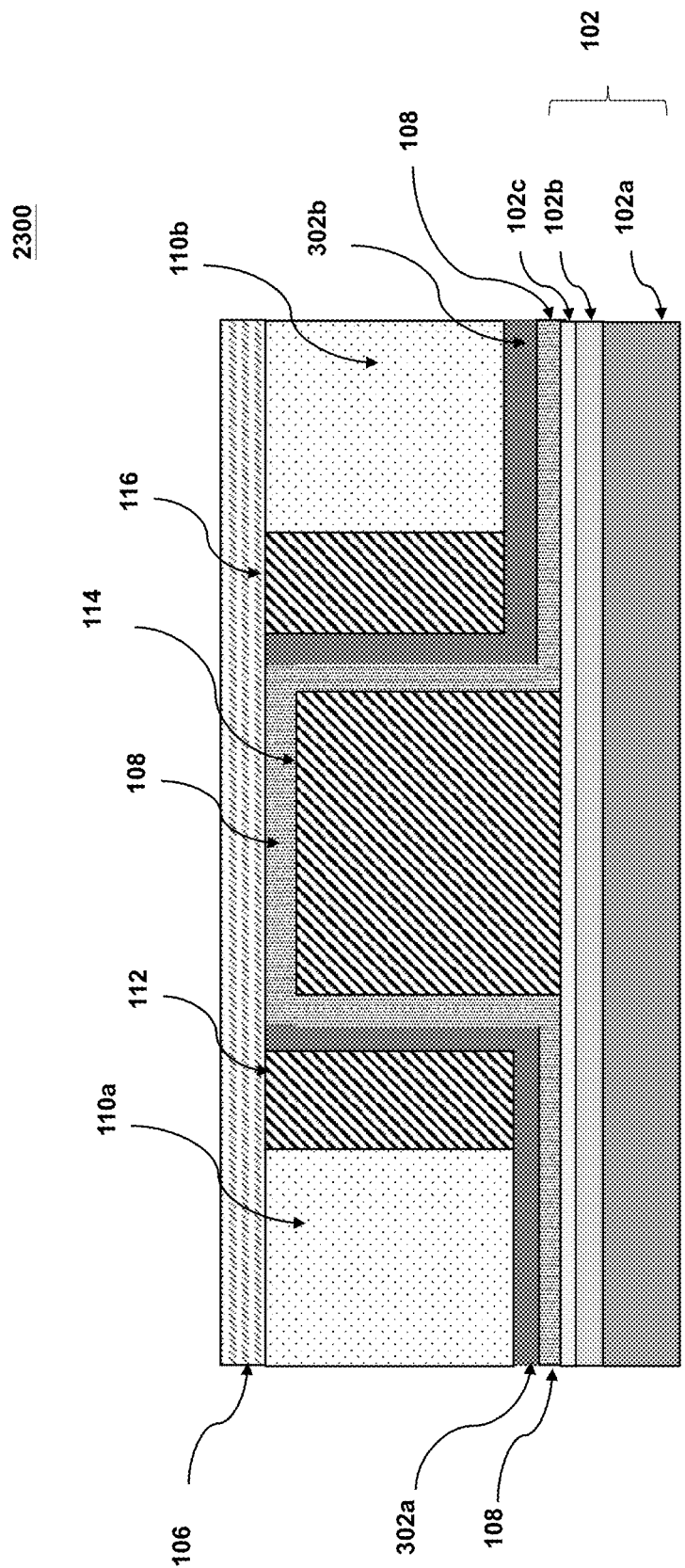
FIG. 23 is a vertical cross-sectional view of a back channel FET device formed after deposition of a semiconductor layer over a top surface of the structure of FIG. 22, according to various embodiments.

FIGS. 20 to 22 illustrate intermediate structures 200, 2100 and 2200 in the formation of the improved back channel FET device 2300 of FIG. 23, according to various embodiments. As shown in FIG. 16, for example, a high-k dielectric layer 108L may be formed over the gate electrode 114 including over the top and side surfaces of the gate electrode 114 and over surfaces of the substrate 102 adjacent to the gate electrode 114. In addition to the high-k dielectric layer 108L of FIG. 16, an etch stop layer 302 may be formed over the high-k dielectric layer 108, as shown in FIG. 20. FIG. 21 illustrates an intermediate structure 2100 after deposition of a first oxide layer 110a, a second oxide layer 110b, and a patterned photoresist 804, as described above with reference to FIGS. 8 and 17. FIG. 22 illustrates an intermediate structure 2200 after formation of a source electrode 112 and a drain electrode 116 in intermediate structure 2100 of FIG. 21. The intermediate structure 2200 may be planarized such that the top surface of the etch stop layer 302 may be removed to form the first etch stop layer 302a and the second etch stop layer 302b. In addition, the high-k dielectric layer 108L may be exposed. The gate dielectric 108 may formed from a uniform high-k dielectric material 108L. FIG. 23 is a vertical cross-sectional view of a back channel FET device 2300 formed after deposition of a semiconductor layer over a top surface of the intermediate structure 2200 of FIG. 22, according to various embodiments.

Each of the above-described embodiment devices 1300, 1400, 1500, 1900, and 2300 (e.g., see FIGS. 13 to 15, 19, and 23) have an advantage that the source electrode 112, the drain electrode 116, and the gate electrode 114 may be closely spaced to one another as they may be separated from one another by the first etch-stop layer 302a and the second etch-stop layer 302b (e.g., devices 1300, 1400, and 1500 of FIGS. 13 to 15), by the high-k dielectric layer 108 (e.g., device 1900 of FIG. 19), or by a multi-layer structure including the first etch-stop layer 302a and the second etch-stop layer 302b and a high-k dielectric layer 108 (e.g., device 2300 of FIG. 23).

Further, the presence of the first etch-stop layer 302a and the second etch-stop layer 302b and/or the high-k dielectric layer 108L acts to prevent short circuit connections from forming between the source electrode 112, the drain electrode 116, and the gate electrode 114. Each of these embodiments also uses a simpler manufacturing process, in contrast to processes used to fabricate alternative embodiments such as structure 200 of FIG. 2, which involves a more complicated process involving trench etching and CMP to form the gate metal region 114, and the source electrode 112 and drain electrode 116 contacts.

Figure 24:
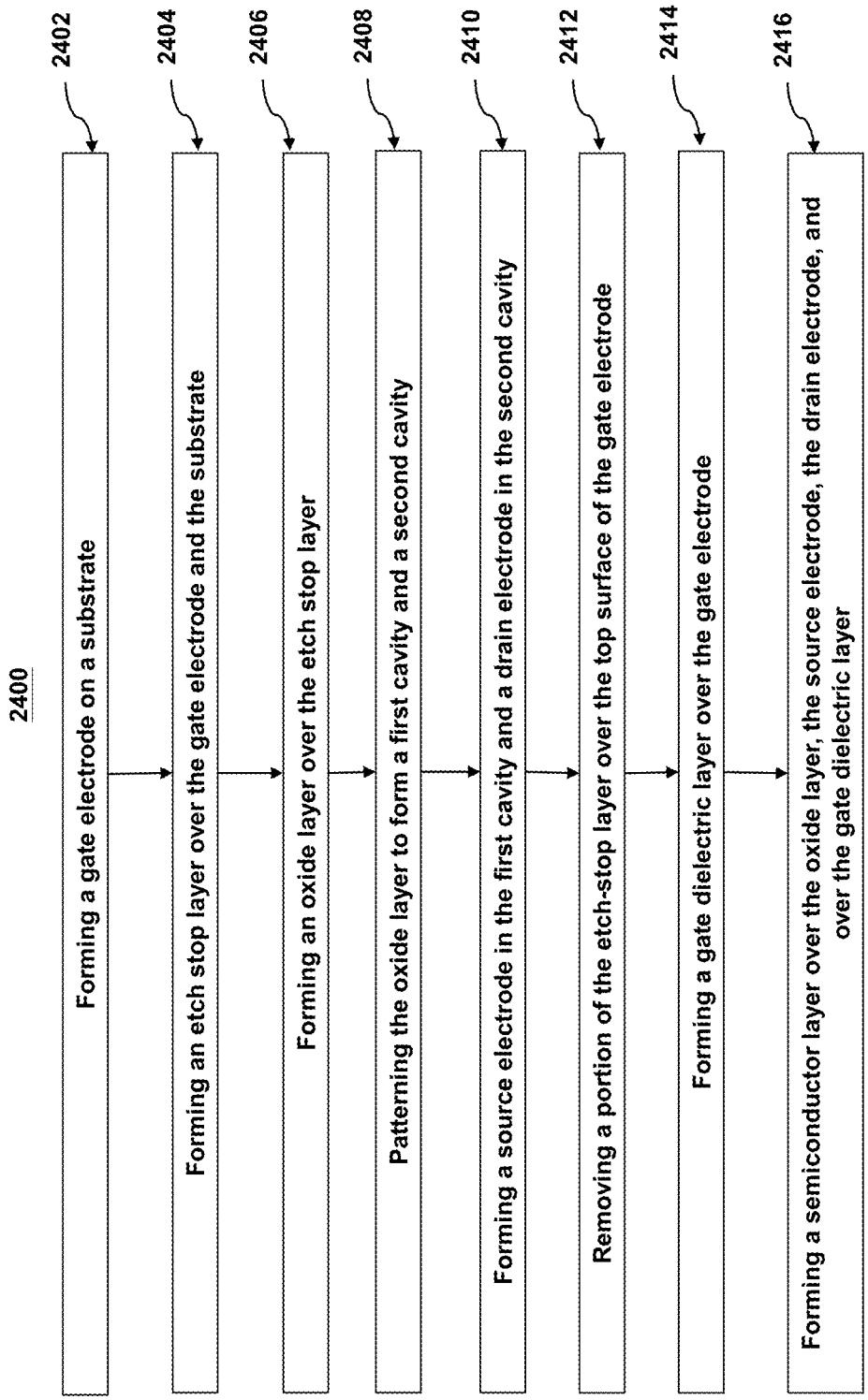
FIG. 24 is a flowchart illustrating various stages of a method of manufacturing an improved back channel FET device, according to various embodiments.

FIG. 24 is a flowchart 2400 showing various stages of a method 2400 of manufacturing an improved back channel FET device, according to various embodiments. In operation 2402, the method 2400 may include forming a gate electrode 114 on a substrate 102. This operation is described above with reference to FIGS. 4 to 6. As shown in FIG. 4, the operation may include forming a substrate 102 by forming super barrier layers 102b and 102c over a substrate 102a. Super barrier layers 102b and 102c may include metal oxides and/or metal nitrides. For example, one or more of the super barrier layers 102b and 102c may include aluminum oxide. The substrate layer 102a may include a semiconductor material or a semiconductor oxide material. For example, substrate 102 may include silicon dioxide. Other embodiments may include other semiconductor materials or semiconductor oxides.

A blanket of gate metal material 114L may then be formed over the super barrier layer 102c. The formation of the gate electrode 114 (e.g., see FIG. 6) in operation 2402 of the method 2400 may further include forming a patterned photoresist 502 (e.g., see FIG. 5) over the blanket of gate metal material 114L. An anisotropic etch may then be performed to remove unmasked regions of the blanket of gate metal material 114L to thereby generate the gate electrode 114, as shown in FIG. 6.

In operation 2404, the method 2400 may include forming a etch-stop layer 302 over the gate electrode 114 and over the substrate 102. The etch-stop layer 302 may be conformally formed over the gate electrode 114 and over adjacent surface of the substrate.

In operation 2406, the method 2400 may include forming an oxide layer 110 over the etch-stop layer 302. Excess portions of the deposited oxide layer 110 may be removed from above a top surface of the structure (e.g., above the etch-stop layer 302 covering gate electrode 114 in FIG. 7) by a planarization process, for example, by CMP. The planarization process divides the oxide layer into a first oxide layer 110a and a second oxide layer 110b, as described above with reference to FIG. 8.

In operation 2408, the method 2400 may include patterning the first oxide layer 110a and the second oxide layer 110b. In operation 2410, the method 2400 may include forming a source electrode 112 and a drain electrode 116. An anisotropic etch process may be performed to remove regions of the first oxide layer 110a and the second oxide layer 110b that are not masked by the photoresist to thereby generate source and drain cavities (not shown). The source and drain cavities may be filled with a conductive material to respectively form the source electrode 112 and the drain electrode 116 (e.g., see FIG. 9). After etching, any residual photoresist may be removed by ashing or dissolution with a solvent.

In operation 2412, the method 2400 may include removing a portion of the etch-stop layer 302. For example, in the embodiments of FIGS. 7 to 13, and 15, a portion of the etch-stop layer 302 is removed to expose the top surface of the gate electrode 114. Alternatively, in the embodiment of FIG. 14, a partial etch process of the etch stop layer 302 may be performed to leave the thin layer 302r of the etch-stop layer 302 remains over the gate electrode 114.

With the embodiments of FIGS. 13 to 15, as shown in FIG. 10, for example, a cavity 1002 may be formed by selectively etching the etch-stop layer 302 to expose the top surface of the gate electrode 114. Various wet and dry etching processes may be used to selectively etch the etch-stop layer 302. In some alternative embodiments, as described above with reference to FIG. 14, the etch process may be stopped prior to etching all the way to the top surface of the gate electrode 114 so that a thin layer 302r of the etch-stop layer 302 remains over the gate electrode 114 (e.g., see FIG. 14).

In operation 2414, the method 2400 may include forming a high-k dielectric layer 108L over the gate electrode. For example, in the embodiments of FIGS. 13 to 15, the blanket layer of high-k dielectric layer 108L may be planarized to form the gate dielectric 108 over the gate electrode 114.

In operation 2416, the method 2400 may include forming a semiconductor layer 106 over the first oxide layer 110a, the second oxide layer 110b, the source electrode 112, the drain electrode 116, the first etch-stop layer 302a, the second etch-stop layer 302b, and over the gate dielectric 108. The semiconductor layer 106 may include at least one elemental semiconductor material (e.g., a single crystal silicon layer), at least one III-V compound semiconductor material, at least one II-VI compound semiconductor material, at least one organic semiconductor material, or other semiconductor materials. The semiconductor layer 106 may then be doped to form a source active region 1304, a drain active region 1306, and a channel region 1308, as described above with reference to FIG. 13.

The method 2400 may be modified in various ways to incorporate additional method stages or to remove some of the method stages listed in FIG. 24. For example, similar methods may be followed to fabricate the alternative improved back channel FET device structures 1900 and 2300, as described above with reference to FIGS. 19 and 23, respectively. All such variations of method 2400 may be envisioned by persons of ordinary skill in the art and are therefore within the scope of the disclosure and claims.

FIG. 25 is a flowchart 2500 showing various stages of a method 2500 of manufacturing an improved back channel FET device (e.g., devices 1900 and 2300 of FIGS. 19 and 23), according to various embodiments. In operation 2502, the method 2500 may include forming a gate electrode 114 on a substrate 102. This operation is described above with reference to FIGS. 4 to 6. In this regard, forming the gate electrode 114 includes forming a gate metal layer 114L over the substrate 102, forming a patterned photoresist 502 over the gate metal layer, 114L and etching the gate metal layer 114L to form the gate electrode 114.

In operation 2504, the method 2500 may include forming a high-k dielectric layer 108L over the gate electrode 114 and over the substrate 102 (e.g., see FIG. 16). The high-k dielectric layer 108L may be conformally formed over the gate electrode 114 and over adjacent surface of the substrate. In operation 2506, the method 2500 may optionally include forming an etch-stop layer 302 over the high-k dielectric layer 108L as shown, for example, in FIG. 20. Forming the etch-stop layer 302 may include depositing a silicon-containing dielectric material including one of silicon nitride, silicon oxynitride, silicon carbide, or silicon carbide nitride.

In operation 2508, the method 2500 may include forming an oxide layer 110 over the high-k dielectric layer 108L (e.g., see FIGS. 17 and 21). Excess portions of the deposited oxide layer 110 may be removed from above a top surface of the structure (e.g., above the high-k dielectric layer 108L covering gate electrode 114 in FIG. 7) by a planarization process, for example, by CMP. The planarization process divides the oxide layer into a first oxide layer 110a and a second oxide layer 110b, as described above with reference to FIGS. 8, 17, and 21.

In operation 2510, the method 2500 may include patterning the first oxide layer 110a and the second oxide layer 110b (e.g., see FIGS. 17 and 21). In operation 2512, the method 2500 may include forming a source electrode 112 and a drain electrode 116 (e.g., see FIGS. 18 and 22). An anisotropic etch process may be performed to generate source and drain cavities (not shown). The source and drain cavities may be filled with a conductive material to respectively form the source electrode 112 and the drain electrode 116 (e.g., see FIG. 9).

In operation 2514, the method 2500 may include forming a semiconductor layer 106 over the first oxide layer 110a, the second oxide layer 110b, the source electrode 112, the drain electrode 116, and over the gate dielectric 108. The semiconductor layer 106 may include at least one elemental semiconductor material (e.g., a single crystal silicon layer), at least one III-V compound semiconductor material, at least one II-VI compound semiconductor material, at least one organic semiconductor material, or other semiconductor materials. The semiconductor layer 106 may then be doped to form a source active region 1304, a drain active region 1306, and a channel region 1308, as described above with reference to FIG. 13.

Referring to the various figures, a semiconductor device (e.g., improved back channel FET devices 1300 to 1500 of FIGS. 13 to 15, respectively) may be provided, wherein the semiconductor device may include a substrate 102; a gate electrode 114 formed on the substrate 102; a gate dielectric 108 formed over a top surface of the gate electrode 114; a source electrode 112 located adjacent to a first side of the gate electrode 114; a first etch-stop layer 302a that separates the source electrode 112 from the gate electrode 114 and from the substrate 102; a drain electrode 116 located adjacent to a second side of the gate electrode 114; a second etch-stop layer 302b that separates the drain electrode 116 from the gate electrode 114 and from the substrate 102; and a semiconductor layer 106 formed over the source electrode 112, the drain electrode 116, and the gate dielectric 108.

In one embodiment, the substrate may include: a first substrate layer 102a may include silicon dioxide; a second substrate layer 102b may include a first super barrier layer formed over the first substrate layer 102a; and a third substrate layer 102c may include a second super barrier layer formed over the second substrate layer 102b, wherein one or both of the second substrate layer 102b and the third substrate layer 102c may include at least one of a metal oxide or a metal nitride. In one embodiment, the first etch-stop layer and the second etch-stop layer may include: a silicon-containing dielectric material that includes silicon nitride, silicon oxynitride, silicon carbide, or silicon carbide nitride.

In one embodiment, the source electrode and the drain electrode each include: a metallic liner material a metal fill material. In one embodiment, the gate dielectric 108 may include a uniform layer of high-k dielectric material 108L or a multi-layer structure including a high-k dielectric layer 108L and a third etch-stop layer 302r.

In one embodiment, the semiconductor device may further include: a first oxide layer 110a adjacent to the source electrode 112 on the first side of the gate electrode 114, the first oxide layer 110a formed over the first etch-stop layer 302a; a second oxide layer 110b adjacent to the drain electrode 116 on the second side of the gate electrode 114, the second oxide layer 110b formed over the second etch-stop layer 302b; wherein the semiconductor layer 106 is further formed over the first oxide layer 110a and the second oxide layer 110b. In one embodiment, the semiconductor layer 106 may include: a source active region 1304 that is doped with a first conductivity type dopant and a second conductivity type dopant that is opposite to that of the first conductivity type; a drain active region 1306 that is doped with the first conductivity type dopant and the second conductivity type dopant; and a channel region 1308 that is doped with the first conductivity type dopant and is located between the source active region and the drain active region.

Referring to the various figures, a semiconductor device (e.g., improved back channel FET devices 1900 and 2300 of FIGS. 19 and 23, respectively) may be provided, wherein the semiconductor device may include a substrate 102, a gate electrode 114 that may be formed on a substrate 102 (102a, 102b, 102c), and a gate dielectric 108 that may be formed over a top surface of the gate electrode 114, over a first side of the gate electrode 114 and on the substrate adjacent to the first side of the gate electrode 114, and over a second side of the gate electrode 114, and over the substrate 102 adjacent to the second side of the gate electrode 114; a source electrode 116 formed on the first side of the gate electrode 114 and separated from the gate electrode 114 and from the substrate 102 by the gate dielectric 108; a drain electrode 116 formed on a second side of the gate electrode 114 and separated from the gate electrode 114 and from the substrate 102 by the gate dielectric 108; a semiconductor layer 106 formed over the source electrode 112, the drain electrode 116, and over the gate dielectric 108.

In one embodiment, the gate dielectric 108 may include one of hafnium oxide, hafnium silicon oxide, hafnium tantalum oxide, hafnium titanium oxide, hafnium zirconium oxide, zirconium oxide, titanium oxide, aluminum oxide, and hafnium dioxide-alumina. In one embodiment, the substrate 102 may include: a first substrate layer 102a that includes silicon dioxide; a second substrate layer 102b that includes a super barrier layer formed over the first substrate layer 102a; and a third substrate layer 102c that includes a super barrier layer formed over the second substrate layer 102b, wherein one or both of the second substrate layer 102b and the third substrate layer 102c may include at least one of a metal oxide or a metal nitride.

In one embodiment, the source electrode 112 and the drain electrode 116 each may include a metallic liner material and a metal fill material. In one embodiment, the semiconductor device may include a first oxide layer 110a adjacent to the source electrode 112 on the first side of the gate electrode 114, the first oxide layer 110a formed over the gate dielectric 108; a second oxide layer 110b adjacent to the drain electrode 116 on the second side of the gate electrode 114, the second oxide layer 110b formed over the gate dielectric 108; wherein the semiconductor layer 106 is further formed over the first oxide layer 110a and the second oxide layer 110b and includes at least one of an elemental semiconductor material, a III-V compound semiconductor material, a II-VI compound semiconductor material, and organic semiconductor material.

In one embodiment, the semiconductor layer 106 may include: a source active region 1304 that is doped with a first conductivity type dopant and a second conductivity type dopant that is opposite to that of the first conductivity type; a drain active region 1306 that is doped with the first conductivity type dopant and the second conductivity type dopant; and a channel region 1308 that is doped with the first conductivity type dopant and is located between the source active region 1304 and the drain active region 1306.

Referring to the various figures, a semiconductor device (e.g., improved back channel FET device 2300 of FIG. 23) may be provided, wherein the semiconductor device may include: a substrate 102; a gate electrode 114 formed on the substrate 102; a gate dielectric 108 formed over a top surface of the gate electrode 114, over a first side of the gate electrode 114 and on the substrate 102 adjacent to the first side of the gate electrode 114, and over a second side of the gate electrode 114 and over the substrate 102 adjacent to the second side of the gate electrode 114; a source electrode 112 formed on the first side of the gate electrode 114; a drain electrode 116 formed on a second side of the gate electrode 114; a first etch-stop layer 302a formed over the gate dielectric 108 such that the first etch-stop layer 302a separates the source electrode 112 from the gate dielectric 108; a second etch-stop layer 302b formed over the gate dielectric 108 such that the second etch-stop layer 302b separates the drain electrode 116 from the gate dielectric 108; and a semiconductor layer 106 formed over the source electrode 112, the drain electrode 116, and over the gate dielectric 108.

The above-described systems and methods provide advantages over front channel FET devices, such as the front channel FET device 100 of FIG. 1, and over alternative back channel FET devices, such as the back channel FET device 200 of FIG. 2. In this regard, depositing the semiconductor layer 106 over the gate dielectric layer 108 avoids potential damage that may be caused by depositing the dielectric layer 108 over the semiconductor layer 106, for example, as with the front channel FET structure 100 of FIG. 1. Further, the disclosed systems and methods avoid the need to perform an etch through the oxide layer 110 and through the dielectric layer 108 down to the semiconductor material 106, as with the front channel FET device 100 of FIG. 1. The devices 1300 to 1500, 1900, and 2300 are thus fabricated with a method that avoids damage to the semiconductor layer 106 that may otherwise be caused by such etching.

Each of these embodiments may have an advantage that the source electrode 112, the drain electrode 116, and the gate electrode 114 may be closely spaced. In this regard, the source electrode 112 is separated from the gate electrode 114 and the substrate 102 by the first etch-stop layer 302a and/or by the high-k dielectric layer 108. Similarly, the drain electrode 116 is separated from the gate electrode 114 and the substrate 102 by the second etch-stop layer 302b and/or by the high-k dielectric layer 108.

Further, the presence of the first etch-stop layer 302a, the second etch-stop layer 302b, and/or by the high-k dielectric layer 108, act to prevent short circuit connections from forming between two or more of the source electrode 112, the drain electrode 116, and the gate electrode 114. Each of these embodiments also are fabricated using a simpler manufacturing process in contrast to processes used to fabricate alternative embodiments such as structure 200 of FIG. 2, which requires a more complicated process involving trench etching and CMP to form the gate metal region 114, and the source electrode 112 and drain electrode 116 contacts.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A semiconductor device, comprising:
   a substrate;
   a gate electrode formed on the substrate;
   a gate dielectric formed over a top surface of the gate electrode;
   a source electrode located adjacent to a first side of the gate electrode;
   a first etch-stop layer that separates the source electrode from the gate electrode and from the substrate;
   a drain electrode located adjacent to a second side of the gate electrode;
   a second etch-stop layer that separates the drain electrode from the gate electrode and from the substrate; and
   a semiconductor layer formed over the source electrode, the drain electrode, and the gate dielectric.

2. The semiconductor device of claim 1, wherein the substrate comprises:
   a first substrate layer comprising silicon dioxide;
   a second substrate layer comprising a first barrier layer formed over the first substrate layer; and
   a third substrate layer comprising a second barrier layer formed over the second substrate layer,
   wherein one or both of the second substrate layer and the third substrate layer comprises at least one of a metal oxide or a metal nitride.

3. The semiconductor device of claim 1, wherein the first etch-stop layer and the second etch-stop layer comprise:
   a silicon-containing dielectric material that comprises silicon nitride, silicon oxynitride, silicon carbide, or silicon carbide nitride.

4. The semiconductor device of claim 1, wherein the source electrode and the drain electrode each comprise:
   a metallic liner material comprising TiN, TaN, WN, TiC, TaC, or WC; and
   a metal fill material comprising one or more of W, Cu, Al, Co, Ru, Mo, Ta, and Ti, and alloys thereof.

5. The semiconductor device of claim 1, wherein the gate dielectric comprises:
   a uniform layer of high-k dielectric material; or
   a multi-layer structure including a high-k dielectric layer and a third etch-stop layer,
   wherein the high-k dielectric material comprises one or more of hafnium oxide, hafnium silicon oxide, hafnium tantalum oxide, hafnium titanium oxide, hafnium zirconium oxide, zirconium oxide, titanium oxide, aluminum oxide, and hafnium dioxide-alumina, and
   wherein the etch-stop layer comprises a silicon-containing dielectric material that comprises silicon nitride, silicon oxynitride, silicon carbide, or silicon carbide nitride.

6. The semiconductor device of claim 1, further comprising:
a first oxide layer adjacent to the source electrode on the first side of the gate electrode, the first oxide layer formed over the first etch-stop layer;
a second oxide layer adjacent to the drain electrode on the second side of the gate electrode, the second oxide layer formed over the second etch-stop layer;
wherein the semiconductor layer is further formed over the first oxide layer and the second oxide layer and comprises at least one of an elemental semiconductor material, a III-V compound semiconductor material, a II-VI compound semiconductor material, and organic semiconductor material.

7. The semiconductor device of claim 1, wherein the semiconductor layer comprises:
a source active region that is doped with a first conductivity type dopant and a second conductivity type dopant that is opposite to that of the first conductivity type dopant;
a drain active region that is doped with the first conductivity type dopant and the second conductivity type dopant; and
a channel region that is doped with the first conductivity type dopant and is located between the source active region and the drain active region.

8. A semiconductor device, comprising:
a substrate;
a gate electrode formed on the substrate;
a gate dielectric formed over a top surface of the gate electrode, over a first side of the gate electrode and on the substrate adjacent to the first side of the gate electrode, and over a second side of the gate electrode and over the substrate adjacent to the second side of the gate electrode;
a source electrode formed on the first side of the gate electrode and separated from the gate electrode and from the substrate by the gate dielectric;
a drain electrode formed on a second side of the gate electrode and separated from the gate electrode and from the substrate by the gate dielectric; and
a semiconductor layer formed over the source electrode, the drain electrode, and over the gate dielectric,
wherein top surfaces of the source electrode and drain electrode are substantially planar, and
wherein the semiconductor layer comprises a substantially planar lower surface that is in direct electrical contact with, and extends laterally beyond, the substantially planar top surfaces of the source electrode and the drain electrode.

9. The semiconductor device of claim 8, wherein the gate dielectric comprises one of hafnium oxide, hafnium silicon oxide, hafnium tantalum oxide, hafnium titanium oxide, hafnium zirconium oxide, zirconium oxide, titanium oxide, aluminum oxide, and hafnium dioxide-alumina.

10. The semiconductor device of claim 8, wherein the substrate comprises:
a first substrate layer comprising silicon dioxide;
a second substrate layer comprising a super barrier layer formed over the first substrate layer; and
a third substrate layer comprising a super barrier layer formed over the second substrate layer,
wherein one or both of the second substrate layer and the third substrate layer comprises at least one of a metal oxide or a metal nitride.

11. The semiconductor device of claim 8, wherein the source electrode and the drain electrode each comprise:
a metallic liner material comprising TiN, TaN, WN, TiC, TaC, or WC; and
a metal fill material comprising one or more of W, Cu, Al, Co, Ru, Mo, Ta, and Ti, and alloys thereof.

12. The semiconductor device of claim 8, further comprising:
a first oxide layer adjacent to the source electrode on the first side of the gate electrode, the first oxide layer formed over the gate dielectric;
a second oxide layer adjacent to the drain electrode on the second side of the gate electrode, the second oxide layer formed over the gate dielectric;
wherein the semiconductor layer is further formed over the first oxide layer and the second oxide layer and comprises at least one of an elemental semiconductor material, a III-V compound semiconductor material, a II-VI compound semiconductor material, and organic semiconductor material.

13. The semiconductor device of claim 8, wherein the semiconductor layer comprises:
a source active region that is doped with a first conductivity type dopant and a second conductivity type dopant that is opposite to that of the first conductivity type dopant;
a drain active region that is doped with the first conductivity type dopant and the second conductivity type dopant; and
a channel region that is doped with the first conductivity type dopant and is located between the source active region and the drain active region.

14. A semiconductor device, comprising:
a substrate;
a gate electrode formed on the substrate;
a gate dielectric formed over a top surface of the gate electrode, over a first side of the gate electrode and on the substrate adjacent to the first side of the gate electrode, and over a second side of the gate electrode and over the substrate adjacent to the second side of the gate electrode;
a source electrode formed on the first side of the gate electrode;
a drain electrode formed on a second side of the gate electrode;
a first etch-stop layer formed over the gate dielectric such that the first etch-stop layer separates the source electrode from the gate dielectric;
a second etch-stop layer formed over the gate dielectric such that the second etch-stop layer separates the drain electrode from the gate dielectric; and
a semiconductor layer formed over the source electrode, the drain electrode, and over the gate dielectric.

15. The semiconductor device of claim 14, wherein the gate dielectric comprises a high-k dielectric material, the high-k dielectric material comprises one of hafnium oxide, hafnium silicon oxide, hafnium tantalum oxide, hafnium titanium oxide, hafnium zirconium oxide, zirconium oxide, titanium oxide, aluminum oxide, and hafnium dioxide-alumina.

16. The semiconductor device of claim 14, wherein the substrate comprises:
a first substrate layer comprising silicon dioxide;
a second substrate layer comprising a super barrier layer formed over the first substrate layer; and
a third substrate layer comprising a super barrier layer formed over the second substrate layer, wherein one or both of the second substrate layer and the third substrate layer comprises at least one of a metal oxide or a metal nitride.

17. The semiconductor device of claim 14, wherein the source electrode and the drain electrode each comprise:
   a metallic liner material comprising TiN, TaN, WN, TiC, TaC, or WC; and
   a metal fill material comprising one or more of W, Cu, Al, Co, Ru, Mo, Ta, and Ti, and alloys thereof.

18. The semiconductor device of claim 14, further comprising:
   a first oxide layer formed adjacent to the source electrode such that the first oxide layer is formed over the first etch-stop layer;
   a second oxide layer adjacent to the drain electrode such that the first oxide layer is formed over the second etch-stop layer;
   wherein the semiconductor layer is further formed over the first oxide layer and the second oxide layer and comprises at least one of an elemental semiconductor material, a III-V compound semiconductor material, a II-VI compound semiconductor material, and organic semiconductor material.

19. The semiconductor device of claim 14, wherein the first etch-stop layer and the second etch-stop layer comprise:
   a silicon-containing dielectric material that comprises silicon nitride, silicon oxynitride, silicon carbide, or silicon carbide nitride.

20. The semiconductor device of claim 14, wherein the semiconductor layer comprises:
   a source active region that is doped with a first conductivity type dopant and a second conductivity type dopant that is opposite to that of the first conductivity type dopant;
   a drain active region that is doped with the first conductivity type dopant and the second conductivity type dopant; and
   a channel region that is doped with the first conductivity type dopant and is located between the source active region and the drain active region.

* * * * *